US 9,455,854 B2

(12) United States Patent
Gao et al.

(10) Patent No.: US 9,455,854 B2
(45) Date of Patent: Sep. 27, 2016

(54) PHASE-LOCKED LOOP FREQUENCY CALIBRATION METHOD AND SYSTEM

(71) Applicant: Huawei Technologies Co., Ltd., Shenzhen (CN)

(72) Inventors: Peng Gao, Shanghai (CN); Nianyong Zhu, Shanghai (CN); Jian Liang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/730,008

(22) Filed: Jun. 3, 2015

(65) Prior Publication Data

US 2015/0349992 A1 Dec. 3, 2015

(30) Foreign Application Priority Data

Jun. 3, 2014 (CN) .......................... 2014 1 0242385

(51) Int. Cl.
*H04L 27/152* (2006.01)
*H04L 7/033* (2006.01)
(Continued)

(52) U.S. Cl.
CPC .............. *H04L 27/152* (2013.01); *H03L 7/18* (2013.01); *H04B 1/16* (2013.01); *H04B 17/14* (2015.01); *H04B 17/21* (2015.01); *H04L 7/0331* (2013.01)

(58) Field of Classification Search
CPC ..... H03L 7/18; H03L 2207/06; H03L 7/187; H03L 2207/12; H03L 7/107; H03L 2207/14; H03L 7/089; H03L 7/0331; H04B 17/21; H04B 17/11
USPC .................................................. 375/371–376
See application file for complete search history.

(56) References Cited

U.S. PATENT DOCUMENTS 7,047,146 B2 * 5/2006 Chuang ................... H03L 7/199
702/106
7,154,342 B2 * 12/2006 Munker ................. H03K 21/12
331/11

(Continued)

FOREIGN PATENT DOCUMENTS

CN 1841936 A 10/2006
CN 101257304 A 9/2008

(Continued)

*Primary Examiner* — Emmanuel Bayard
(74) *Attorney, Agent, or Firm* — Leydig, Voit & Mayer, Ltd.

(57) ABSTRACT

The present invention provides a phase-locked loop frequency calibration method and system, where the method includes: performing, within a counting time $T_{CNT}[k]$, frequency counting on a frequency signal that is output in a current working subband by a voltage-controlled oscillator, to obtain a frequency count value FCNT[k], where the current working subband corresponds to a binary value of a current node in a binary search tree; and calculating an error between FCNT[k] and a target frequency count value $FCNT_{TARGET}[k]$, comparing an absolute value of the error with a predetermined value, dynamically adjusting $T_{CNT}[k]$ in a value range of $T_{CNT}[k]$ according to a comparison result, and determining, in combination with a binary search algorithm, a target subband in which the voltage-controlled oscillator works. Such a dynamic calibration method can effectively shorten the calibration time on the whole.

9 Claims, 14 Drawing Sheets

(51) Int. Cl.
*H04B 17/21* (2015.01)
*H04B 1/16* (2006.01)
*H03L 7/18* (2006.01)
*H04B 17/14* (2015.01)

(56) References Cited

U.S. PATENT DOCUMENTS

| | | | |
|---|---|---|---|
| 7,164,322 B1* | 1/2007 | Knotts | H03L 7/087 331/1 A |
| 7,804,367 B2* | 9/2010 | Lee | H03L 7/087 327/156 |
| 8,008,956 B1* | 8/2011 | Shin | H03L 7/085 327/148 |
| 8,008,979 B2* | 8/2011 | Hirano | H03L 7/085 331/1 A |
| 8,436,686 B2* | 5/2013 | Kuo | H03L 7/087 331/1 R |
| 8,509,372 B1* | 8/2013 | Zhang | H03L 7/087 331/44 |
| 8,750,448 B2* | 6/2014 | Mazkou | H03L 7/081 327/156 |
| 8,755,479 B2* | 6/2014 | Vavelidis | H03L 7/10 375/295 |
| 8,963,593 B2* | 2/2015 | Arai | H03L 7/099 327/147 |
| 9,048,848 B2* | 6/2015 | Chen | H03L 7/103 |
| 9,071,255 B2* | 6/2015 | Lin | H03L 7/099 |
| 2003/0050029 A1* | 3/2003 | Kaufmann | H03L 7/099 455/260 |
| 2006/0220757 A1 | 10/2006 | Satake et al. | |
| 2009/0002079 A1* | 1/2009 | Venuti | H03C 3/0925 331/10 |
| 2009/0153252 A1* | 6/2009 | Chen | H03L 7/0891 331/10 |
| 2012/0313714 A1* | 12/2012 | Kargar | H03L 7/087 331/34 |
| 2013/0222074 A1 | 8/2013 | Hosokawa | |
| 2015/0222279 A1* | 8/2015 | Chen | H03L 7/0891 327/157 |

FOREIGN PATENT DOCUMENTS

| | | |
|---|---|---|
| CN | 101741382 A | 6/2010 |
| CN | 103297038 A | 9/2013 |
| CN | 103731139 A | 4/2014 |
| CN | 104052474 A | 9/2014 |

* cited by examiner

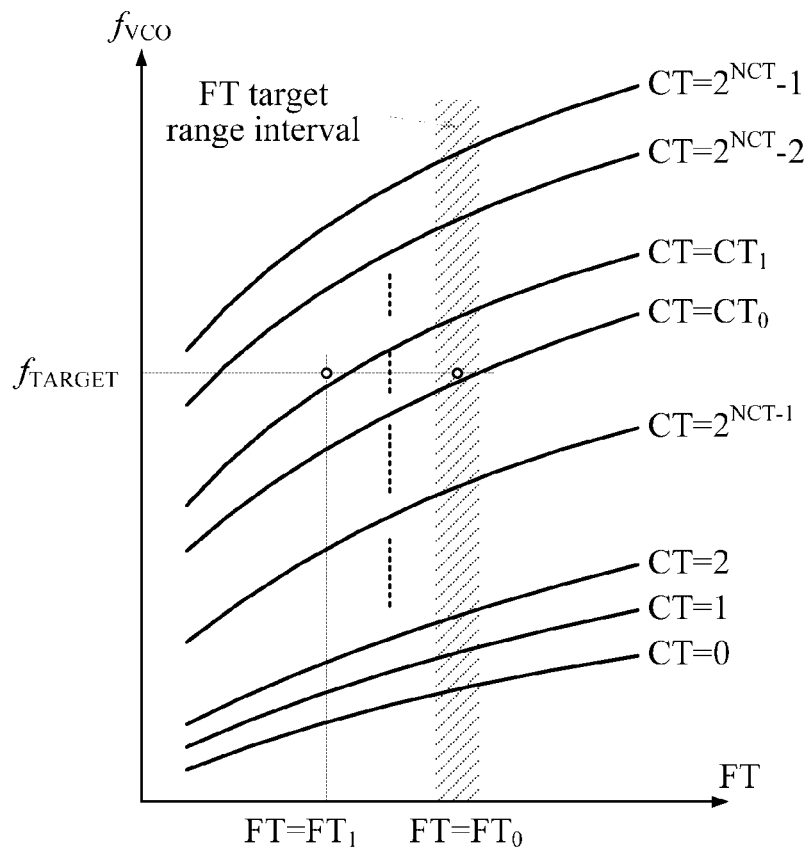

FIG. 3

| Perform, within a counting time, frequency counting on a frequency signal that is output in a current working subband by a voltage-controlled oscillator, to obtain a frequency count value, where the current working subband corresponds to a binary value of a current node in a binary search tree | S401a |

| Calculate an error between the frequency count value and a target frequency count value, compare an absolute value of the error with a predetermined value, dynamically adjust the counting time in a value range of the counting time according to a comparison result, and determine, in combination with a binary search algorithm, a target subband in which the voltage-controlled oscillator works | S402a |

FIG. 4a

PHASE-LOCKED LOOP FREQUENCY CALIBRATION METHOD AND SYSTEM

CROSS-REFERENCE TO RELATED APPLICATIONS

This application claims priority to Chinese Patent Application No. 201410242385.2, filed on Jun. 3, 2014, which is hereby incorporated by reference in its entirety.

TECHNICAL FIELD

The present invention relates to the field of communications technologies, and in particular, to a phase-locked loop frequency calibration method and system.

BACKGROUND

A frequency synthesizer based on a phase-locked loop (PLL) structure is widely used in a wireless radio frequency transceiver, and is configured to generate a local oscillation signal, which is briefly referred to as a local oscillator (LO), to implement a frequency shift of a signal.

In modern wireless communications, a radio frequency transceiver is required to be capable of working in multiple frequency bands, and therefore, it is necessary that an output signal of a phase-locked loop can cover a wide enough frequency range.

To implement a wideband phase-locked loop, a core device, that is, a voltage-controlled oscillator (VCO) in the phase-locked loop also needs to work in a wide enough frequency range. As limited by noise requirements, process conditions, or the like, the voltage-controlled oscillator generally uses a multi-band design structure, that is, multiple subbands are used to cover a wide enough frequency range, but each subband only needs to cover a relatively narrow frequency. A subband is controlled in a manner of a digital code.

In an actual application, a system requires a phase-locked loop to output a specific frequency; and for a multi-band voltage-controlled oscillator, a proper subband needs to be set, so as to meet a requirement of the system on an output frequency, and also meet a requirement on stable working of a phase-locked loop circuit.

Due to fluctuation of a chip manufacturing process and uncertainty of an application environment, an output frequency of each subband of a wideband voltage-controlled oscillator is not stable or fixed. That is, it is very difficult to directly obtain a set value of a subband of a voltage-controlled oscillator according to a target frequency value that is set by the system and needs to be output by the voltage-controlled oscillator.

The following introduces a method for obtaining, by using a target frequency value provided by a system, a subband of a voltage-controlled oscillator in the prior art.

Referring to FIG. 1, FIG. 1 is a schematic diagram of a binary search method in the prior art.

In FIG. 1, a voltage-controlled oscillator that has 16 frequency bands and is controlled by a 4-bit (bit) word is used as an example; and a node in the figure is indicated by a binary control word.

In FIG. 1, up indicates an uplink search path, and do indicates a downlink search path.

A binary algorithm is used to measure, starting from an intermediate subband of the voltage-controlled oscillator, an output frequency of the voltage-controlled oscillator by using a frequency counter, compare obtained information with a target frequency value set by a system, and select a search path according to a comparison result.

For example, a search path in FIG. 1 is: 1000→1100→1110→1101. 1101 is a target subband to be searched for. 1000 is an intermediate subband among the 16 frequency bands.

For each node on the path, counting duration of the frequency counter is $R \times T_{REF}$, and frequency counting precision that can be obtained theoretically is $f_{RES} = f_{REF}/R$, where $f_{REF}$ is a reference frequency for counting, and the reference frequency is a frequency of an input reference clock of a phase-locked loop. $f_{RES}$ is target precision. R can be obtained by using $f_{REF}$ and $f_{RES}$.

R is a counting time reference parameter.

Therefore, if other overheads are not counted, total calibration duration is $t_{CAL} = NCT \times R \times T_{REF}$. NCT is a bit width of a subband control word of a voltage-controlled oscillator. In FIG. 1, NCT=4.

A main problem of the prior art shown in FIG. 1 is that a calibration time is relatively long. The calibration time in the art is estimated in the following by using parameters commonly used in a design of a wireless radio frequency transceiver.

$$f_{REF} = 20 \text{ MHz indicates that } T_{REF} = \frac{1}{f_{REF}} = 50 \text{ ns};$$

$$f_{RES} = 200 \text{ kHz};$$

$$R = \frac{f_{RES}}{f_{RES}} = 100;$$

a subband control word of a voltage-controlled oscillator is generally designed to be NCT=8, and on the premise of not counting other overheads, a time required by calibration is:

$$t_{CAL} = NCT \times R \times T_{REF} = 40 \text{ us; and}$$

when other overheads are counted, a calibration time is generally near 50 us, and for a wireless radio frequency transceiver, a too long calibration time causes a time pressure on other operations of the system.

Therefore, a person skilled in the art needs to provide a phase-locked loop frequency calibration method, which can shorten a calibration time.

SUMMARY

Embodiments of the present invention provide a phase-locked loop frequency calibration method and system, which can shorten a frequency calibration time of a phase-locked loop.

The present invention discloses the following technical solutions:

According a first aspect, a phase-locked loop frequency calibration method is applied to selection of a subband for a multi-band voltage-controlled oscillator, including:

performing, within a counting time $T_{CNT}[k]$, frequency counting on a frequency signal that is output in a current working subband by a voltage-controlled oscillator, to obtain a frequency count value FCNT[k], where the current working subband corresponds to a binary value of a current node in a binary search tree; and calculating an error between FCNT[k] and a target frequency count value $FCNT_{TARGET}[k]$, comparing an absolute value of the error with a predetermined value, dynamically adjusting $T_{CNT}[k]$ in a value range of $T_{CNT}[k]$ according to a comparison result, and determining, in combination with a binary search algorithm, a target subband in which the voltage-controlled oscillator works.

In a first possible implementation manner of the first aspect, the dynamically adjusting $T_{CNT}[k]$ in a value range of $T_{CNT}[k]$ according to a comparison result, and determining, in combination with a binary search algorithm, a target subband in which the voltage-controlled oscillator works is specifically:

if it is determined that the error is 0, using the current working subband as a target subband in which the voltage-controlled oscillator works;

if it is determined that the error is greater than 0 and less than the predetermined value, increasing a counting time reference $T_{CNT}[k]$, continuing to read a frequency count value obtained by frequency counting performed on a frequency signal that is output in a current working subband by the voltage-controlled oscillator, calculating an error between the newly read frequency count value and $FCNT_{TARGET}[k]$, if the error is 0, using the current working subband as the target subband in which the voltage-controlled oscillator works, and if the error is not 0, continuing to compare the error with the predetermined value, continuously increasing $T_{CNT}[k]$ until $T_{CNT}[k]$ reaches a maximum value in the value range of $T_{CNT}[k]$, and forcibly entering a next subband in a binary search; and when the binary search is completed, using a subband that corresponds to a minimum value of the error as the target subband in which the voltage-controlled oscillator works; or if it is determined that the error is greater than or equal to the predetermined value, stopping counting an output frequency, corresponding to the current working subband, of the voltage-controlled oscillator, and entering a next subband in a binary search.

With reference to the first aspect and any one of the foregoing possible implementation manners, in a second possible implementation manner, the entering a next subband in a binary search is specifically:

when the frequency count value is greater than the target frequency count value, selecting, on a binary search path, a subband of which a binary value of a node is less than that of the current working subband, as the next subband; or when the frequency count value is less than the target frequency count value, selecting, on a binary search path, a subband of which a binary value of a node is greater than that of the current working subband, as the next subband.

With reference to the first aspect and either of the foregoing possible implementation manners, in a third possible implementation manner, $T_{CNT}[k]=T_{REF}*R[k]$; and $FCNT_{TARGET}[k]=R[k]\times FCW$, where $T_{REF}$ is a period of a reference clock signal input to a phase-locked loop; R[k] is a counting time parameter, which is a positive integer changing with a current time k, and k is a positive integer; and FCW is a frequency control word signal of the phase-locked loop, and is a known quantity.

With reference to the first aspect and any one of the foregoing possible implementation manners, in a fourth possible implementation manner, $R[k]=2^{k-1}$;

$T_{CNT}[k]=T_{REF}*R[k]=T_{REF}*2^{k-1}$;

$FCNT_{TARGET}[k]=2^{k-1}\times FCW$; and a maximum value of R[k] is $R_{max}$, and when $A=f_{REF}/f_{RES}$ is an integral power of 2, $R_{max}=A$; and when A is not an integral power of 2, $R_{max}$ is set to a minimum value in integral powers of 2 that are greater than A, where $f_{REF}=1/T_{REF}$; and $f_{RES}$ is target precision of the phase-locked loop, and is a known quantity.

According to a second aspect, a phase-locked loop frequency calibration system is provided, including: a phase-locked loop, a frequency counter, and a controller, where the phase-locked loop includes a multi-band voltage-controlled oscillator;

the phase-locked loop is configured to control, according to an input reference clock signal, the voltage-controlled oscillator to output a frequency signal;

the frequency counter is configured to perform, within a counting time $T_{CNT}[k]$, frequency counting on a frequency signal that is output in a current working subband by the voltage-controlled oscillator, to obtain a frequency count value FCNT[k], where the current working subband corresponds to a binary value of a current node in a binary search tree; and the controller is configured to calculate an error between FCNT[k] and a target frequency count value $FCNT_{TARGET}[k]$, compare an absolute value of the error with a predetermined value, dynamically adjust $T_{CNT}[k]$ in a value range of $T_{CNT}[k]$ according to a comparison result, and determine, in combination with a binary search algorithm, a target subband in which the voltage-controlled oscillator works.

In a first possible implementation manner of the second aspect, the dynamically adjusting, by the controller, $T_{CNT}[k]$ in a value range of $T_{CNT}[k]$ according to a comparison result, and determining, in combination with a binary search algorithm, a target subband in which the voltage-controlled oscillator works is specifically:

if it is determined that the error is 0, using the current working subband as the target subband in which the voltage-controlled oscillator works;

if it is determined that the error is greater than 0 and less than the predetermined value, increasing a counting time reference $T_{CNT}[k]$, continuing to read a frequency count value obtained by frequency counting performed on a frequency signal that is output in a current working subband by the voltage-controlled oscillator, calculating an error between the newly read frequency count value and $FCNT_{TARGET}[k]$, if the error is 0, using the current working subband as the target subband in which the voltage-controlled oscillator works, and if the error is not 0, continuing to compare the error with the predetermined value, continuously increasing $T_{CNT}[k]$ until $T_{CNT}[k]$ reaches a maximum value in the value range of $T_{CNT}[k]$, and forcibly entering a next subband in a binary search; and when the binary search is completed, using a subband that corresponds to a minimum value of the error as the target subband in which the voltage-controlled oscillator works; or if it is determined that the error is greater than or equal to the predetermined value, stopping counting an output frequency, corresponding to the current working subband, of the voltage-controlled oscillator, and entering a next subband in a binary search.

With reference to the second aspect and any one of the foregoing possible implementation manners, in a second possible implementation manner, the entering, by the controller, a next subband in a binary search is specifically:

when the frequency count value is greater than the target frequency count value, selecting, on a binary search path, a subband of which a binary value of a node is less than that of the current working subband, as the next subband; or when the frequency count value is less than the target frequency count value, selecting, on a binary search path, a subband of which a binary value of a node is greater than that of the current working subband, as the next subband.

With reference to the second aspect and either of the foregoing possible implementation manners, in a third possible implementation manner, $T_{CNT}[k]=T_{REF}*R[k]$; and $FCNT_{TARGET}[k]=R[k] \times FCW$, where $T_{REF}$ is a period of a reference clock signal input to a phase-locked loop; R[k] is a counting time parameter, which is a positive integer changing with a current time k, and k is a positive integer; and FCW is a frequency control word signal of the phase-locked loop, and is a known quantity.

With reference to the second aspect and any one of the foregoing possible implementation manners, in a fourth possible implementation manner, $R[k]=2^{k-1}$;

$$T_{CNT}[k]=T_{REF}*R[k]=T_{REF}*2^{k-1};$$

$$FCNT_{TARGET}[k]=2^{k-1} \times FCW; \text{ and}$$

a maximum value of R[k] is $R_{max}$, and when $A=f_{REF}/f_{RES}$ is an integral power of 2, $R_{max}=A$; and when A is not an integral power of 2, $R_{max}$ is set to a minimum value in integral powers of 2 that are greater than A, where $f_{REF}=1/T_{REF}$; and $f_{RES}$ is target precision of the phase-locked loop, and is a known quantity.

With reference to the second aspect and any one of the foregoing possible implementation manners, in a fifth possible implementation manner, the phase-locked loop includes: an analog integer-N phase-locked loop, an analog fractional-N phase-locked loop, a digital integer-N phase-locked loop, and a digital fractional-N phase-locked loop.

In the foregoing technical solutions, both a counting time reference and a target frequency count value are set to be variable, while in the prior art, a counting time reference and a target frequency count value are constant. Because a frequency calibration time and frequency calibration precision are contradictory, and there is relatively large difference between many subbands and a target frequency value, it is unnecessary to spend a long time in improving measurement precision for some subbands, but a long time is spent in improving measurement precision for a subband close to the target frequency value, thereby obtaining a calibrated accurate frequency. In the embodiments, a measured error is compared with a preset value, so as to control whether to increase a counting time reference, and perform correct selection between a calibration time and calibration precision, thereby effectively controlling the calibration time. Such a dynamic calibration method can effectively shorten the calibration time on the whole.

BRIEF DESCRIPTION OF DRAWINGS

To describe the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

FIG. 3 is a schematic diagram of a frequency control curve of a voltage-controlled oscillator according to the present invention;

FIG. 4a is a flowchart of Embodiment 1 of a phase-locked loop frequency calibration method according to the present invention;

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

To make the foregoing objectives, features, and advantages of the present invention clearer and more comprehensible, the following describes specific implementation manners of the present invention in detail with reference to the accompanying drawings.

First, in order that a person skilled in the art can better understand working principles of the present invention, the following first introduces basic composition parts of a phase-locked loop.

Figure 2:
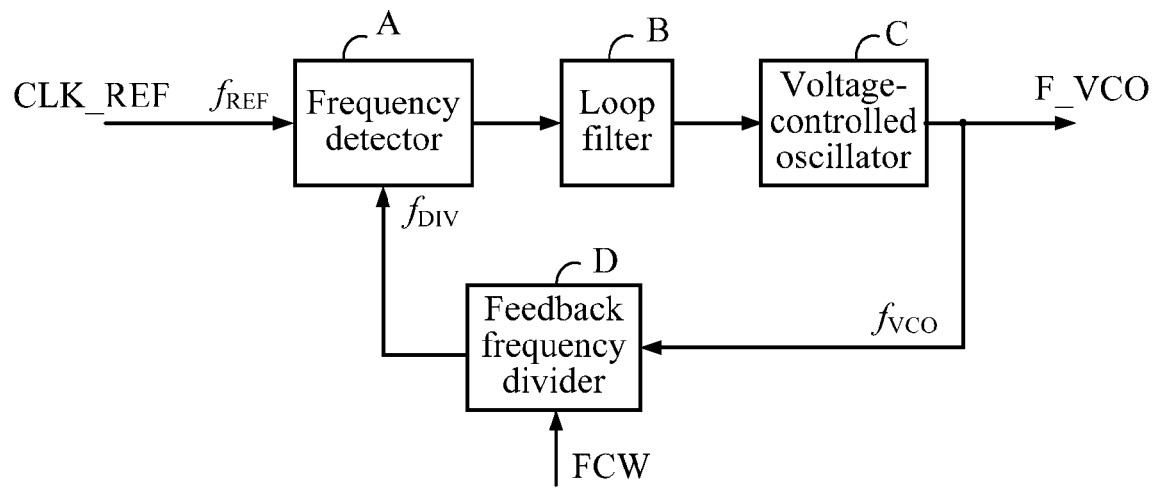
FIG. 2 is a structural diagram of a phase-locked loop in the prior art.

Referring to FIG. 2, this figure is a structural diagram of a phase-locked loop in the prior art.

A phase-locked loop includes four basic composition parts: a frequency detector A, a loop filter B, a voltage-controlled oscillator C, and a feedback frequency divider D, where the voltage-controlled oscillator C is used as a frequency generator to output a frequency.

An output signal of the voltage-controlled oscillator C obtained after acquisition and frequency division, together with a frequency $f_{REF}$ of an input reference clock, is input to the frequency detector A, the frequency detector A outputs, by comparing a difference between $f_{REF}$ and an output frequency $f_{VCO}$ of the voltage-controlled oscillator, an error voltage that is proportional to the frequency difference, and after the loop filter B filters out a high frequency component in the error voltage, a control voltage is output to control the voltage-controlled oscillator C, so that a frequency of an output signal of the voltage-controlled oscillator C is stabilized at a target frequency value, and after frequency division is performed by the feedback frequency divider D on the output frequency $f_{VCO}$ of the voltage-controlled oscillator C, a signal $f_{DIV}$ is fed back to the frequency detector A as a sampling signal of the output frequency.

In a radio frequency transceiver, a voltage-controlled oscillator C in a phase-locked loop is generally implemented by using a multi-subband structure; specifically, a set of capacitor array that can be turned on or off is connected in parallel in the voltage-controlled oscillator C, and is turned on or off by using a digital signal, so as to change a capacitance value presented externally by the capacitor array, thereby implementing switching of a frequency range of the voltage-controlled oscillator C, where each digital signal corresponds to one subband.

In this way, the output frequency of the voltage-controlled oscillator C can be controlled in two manners, that is, coarse tuning and fine tuning.

Coarse tuning (CT): A subband of a voltage-controlled oscillator is selected, a general range of the voltage-controlled oscillator is determined, and selection of the subband of the voltage-controlled oscillator is controlled by using a digital signal, where the digital signal is indicated by CT, that is, a value of each CT corresponds to one subband of the voltage-controlled oscillator.

Fine tuning (FT, Fine Tuning): A voltage-controlled oscillator is controlled, by using a phase-locked loop feedback mechanism, to accurately output a target frequency value set by a system.

CT and FT are generally performed sequentially after the system sets the target frequency value.

Figure 2A:
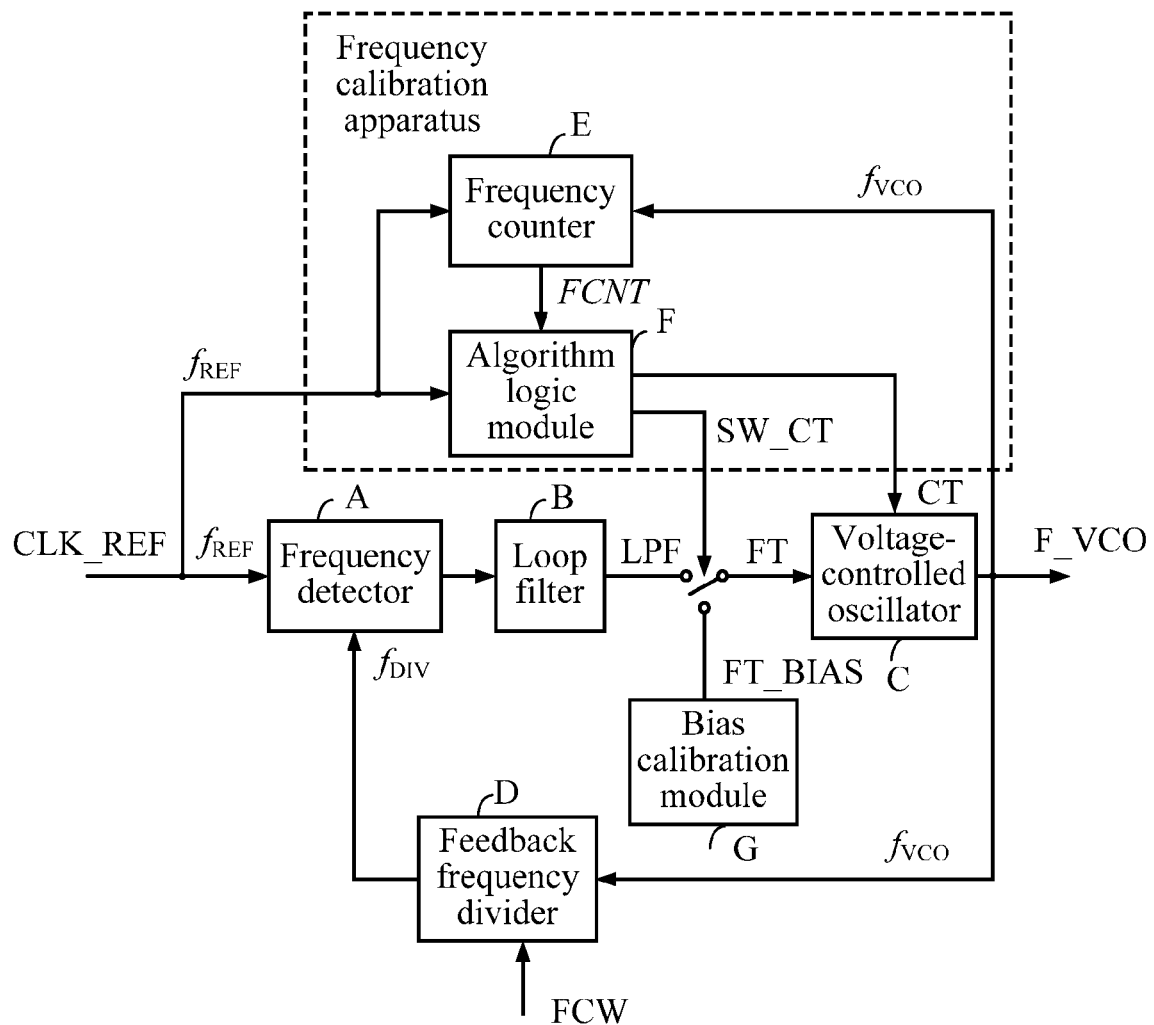
FIG. 2a is a schematic structural diagram of frequency control of a voltage-controlled oscillator according to the present invention.

Referring to FIG. 2a, this figure is a schematic structural diagram of frequency control of a wideband voltage-controlled oscillator according to the present invention.

In this figure, a voltage-controlled oscillator C is a multi-subband voltage-controlled oscillator, selection of a frequency band thereof is implemented by using a coarse tuning (CT) signal, and a value of the CT signal is obtained by using an automatic frequency calibration method provided by the present invention. A value of fine tuning (FT) signal of the voltage-controlled oscillator is obtained by using the phase-locked loop feedback mechanism.

Working principles of a frequency detector A, a loop filter B, a voltage-controlled oscillator C, and a feedback frequency divider D are already introduced in FIG. 2, and therefore, are not specifically described herein.

A signal output by the loop filter B is LPF.

A CLK_REF signal is an input reference clock signal of the phase-locked loop, and in a wireless communications application, CLK_REF is a periodical signal that has a stable frequency. It is assumed that a signal frequency thereof is $f_{REF}$, and a signal period thereof is $$T_{REF} = \frac{1}{f_{REF}}.$$

An F_VCO signal is a phase-locked loop output signal, that is, an output signal of the voltage-controlled oscillator, a signal frequency thereof is $f_{VCO}$, and a signal period thereof is $$T_{VCO} = \frac{1}{f_{VCO}}.$$

An FCW is a frequency control word (FCW) signal of the phase-locked loop, and the system sets an output target frequency value of the phase-locked loop by setting a value of the FCW.

According to a working principle of the phase-locked loop, when the phase-locked loop works stably, an output frequency is the target frequency value: $f_{VCO}=f_{TARGET}$, and the following relationship exists:

$$f_{VCO}=f_{TARGET}=\text{FCW} \times f_{REF} \qquad (1)$$

It may be understood that the FCW is a known quantity.

The FCW is differentiated from the CT, and the FCW is a control word, in the phase-locked loop, provided for the feedback frequency divider D.

The CT signal is used to control selection of a subband of the voltage-controlled oscillator C, and the CT signal is a digital signal.

A frequency counter E and an algorithm logic module F are configured to perform phase-locked loop frequency calibration, and E and F are combined to form a frequency calibration apparatus.

A calibration bias module G is used for initialization, and during initialization, a control switch SW_CT controls the calibration bias module G to output a signal FT_BIAS to the FT, then the FT outputs the signal to the voltage-controlled oscillator C, and an initial value of the CT is set to an intermediate subband. For example, for a 4-bit control in a binary search, an intermediate subband is 1000.

It should be noted that a method provided by this embodiment of the present invention is implemented by using the algorithm logic module F.

Referring to FIG. 3, this figure is a schematic diagram of a frequency control curve of a voltage-controlled oscillator according to the present invention.

As shown in FIG. 3, a set target frequency value is $f_{TARGET}$.

First, a proper CT control signal is selected, as shown in the figure, $CT=CT_0$.

Then a proper FT control signal is obtained by using a phase-locked loop feedback mechanism, as shown in FIG. 3, $FT=FT_0$.

It can be seen from FIG. 3 that for a same target frequency $f_{TARGET}$, there may be multiple subbands that can cover the frequency at the same time; however, selection of different subbands means that selection of a fine tuning FT value changes correspondingly. As shown in FIG. 3, in the two cases in which $CT=CT_0$ and $CT=CT_1$, $f_{TARGET}$ can be covered; and when it is selected that $CT=CT_0$, correspondingly, $FT=FT_0$; and when it is selected that $CT=CT_1$, correspondingly, $FT=FT_1$.

For a phase-locked loop system, generally, the fine tuning signal FT needs to be limited in a certain range for stable running of the system, and this limitation also sets a constraint condition for selection of the coarse tuning signal CT.

As shown in FIG. 3, it is assumed that a target range interval of an FT value set by the system is a range covered by oblique lines in FIG. 3, and to meet this constraint condition, the system can only select that $CT=CT_0$ rather than that $CT=CT_1$.

Due to fluctuation of a chip manufacturing process and uncertainty of an application environment of a chip, a relationship between a target frequency value and a subband corresponding thereto is not fixed.

For example, for a same target frequency value $f_{TARGET}$, in a chip sample A, it should be selected that a subband $CT=CT_0$, but in a chip sample B, due to fluctuation of a chip manufacturing process, it may be the most proper to select that $CT=CT_1$.

Due to the existence of the foregoing uncertain factors, in a wideband phase-locked loop, an apparatus needs to be designed dedicatedly, so that according to a target frequency value set by a system, an optimum subband for a voltage-controlled oscillator can be automatically selected by using the apparatus, that is, a most proper coarse tuning signal is selected, and such a selection process is referred to as frequency calibration of the wideband phase-locked loop.

The present invention mainly introduces that a subband is selected by using CT, and a value of the CT is implemented by means of automatic frequency calibration. An FT signal is obtained by using a phase-locked loop feedback mechanism, which is not specifically introduced in the present invention.

The method provided by the present invention can shorten a time of automatic frequency calibration. Detailed introduction is given below with reference to the accompanying drawings.

Method Embodiment 1

Referring to FIG. 4a, this figure is a flowchart of Embodiment 1 of a phase-locked loop frequency calibration method according to the present invention.

The phase-locked loop frequency calibration method provided by this embodiment is applied to selection of a subband for a multi-band voltage-controlled oscillator, and includes:

S401a: Perform, within a counting time $T_{CNT}[k]$, frequency counting on a frequency signal that is output in a current working subband by a voltage-controlled oscillator, to obtain a frequency count value FCNT[k], where the current working subband corresponds to a binary value of a current node in a binary search tree.

It should be noted that the frequency counting performed on the frequency signal that is output in the current working subband by the voltage-controlled oscillator is implemented by a frequency counter.

It can be understood that for a multi-band voltage-controlled oscillator, a current working subband thereof refers to a binary value corresponding to a current node in a binary search tree. For example, for a voltage-controlled oscillator with 16 frequency bands, a binary value corresponding to a node thereof for which CT=12 is 1100.

It should be noted that for the binary search tree, an initial search starts from a node corresponding to an intermediate subband. For example, for the voltage-controlled oscillator with 16 frequency bands, a node from which an initial search starts is a node for which CT=8 (a corresponding binary value is 1000).

S402a: Calculate an error between FCNT[k] and a target frequency count value $FCNT_{TARGET}[k]$, compare an absolute value of the error with a predetermined value, dynamically adjust $T_{CNT}[k]$ in a value range of $T_{CNT}[k]$ according to a comparison result, and determine, in combination with a binary search algorithm, a target subband in which the voltage-controlled oscillator works.

A reason why a counting time and the target frequency count value are set to be variable in this embodiment is that for a wideband voltage-controlled oscillator, for most subbands on a binary search path, only a relative value relationship between a count value read by a frequency counter and a target frequency needs to be determined, without a need to obtain an accurate output frequency of the voltage-controlled oscillator. However, for a few subbands close to a target frequency value, an accurate output frequency of the voltage-controlled oscillator needs to be learned, and a difference value between the count value read by the frequency counter and the target frequency value is used as a basis for selection of a subband, that is, measurement precision affects a final result of frequency calibration.

Because a compromise relationship exists between frequency measurement precision and a measurement time, in order to shorten a frequency calibration time, a requirement on measurement precision can be lowered for a subband in which only a frequency value needs to be determined. In this way, measurement times in these subbands can be shortened. However, in a subband with a high requirement on measurement precision, measurement precision is ensured to prolong a measurement time. Therefore, a method for dynamically adjusting frequency measurement precision in this embodiment can improve an effect of frequency calibration without affecting calibration precision.

In the phase-locked loop frequency calibration method provided by this embodiment, both a counting time and a target frequency count value are set to be variable, while in the prior art, a counting time and a target frequency count value are constant. Because a frequency calibration time and frequency calibration precision are contradictory, and there is relatively large difference between many subbands and a target frequency value, it is unnecessary to spend a long time in improving measurement precision for some subbands, but a long time is spent in improving measurement precision for a subband close to the target frequency value, thereby obtaining a calibrated accurate frequency. In this embodiment, a measured error is compared with a preset value, so as to control whether to adjust a counting time, thereby effectively controlling a calibration time. Such a dynamic calibration method can effectively shorten the calibration time on the whole.

Method Embodiment 2

Figure 4B:
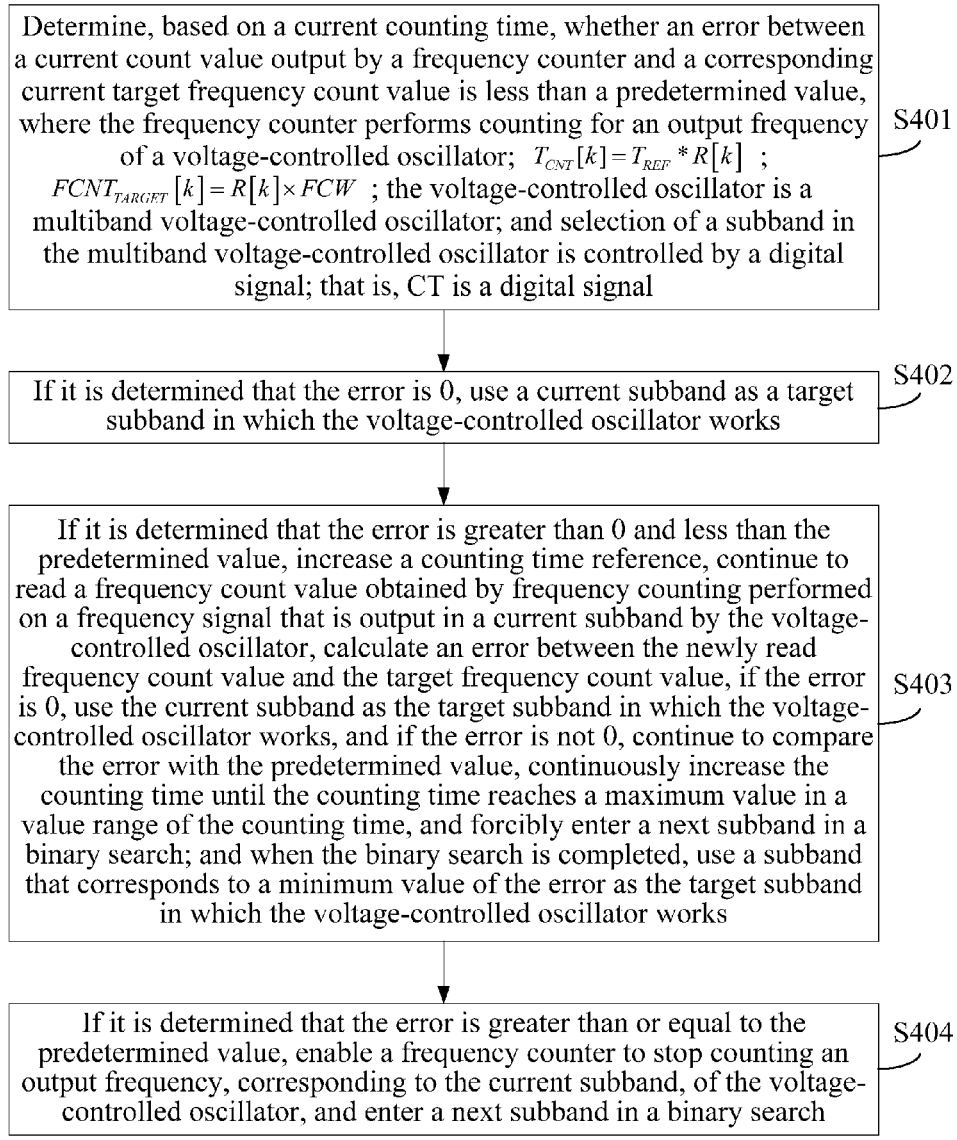
FIG. 4b is a flowchart of Embodiment 2 of a phase-locked loop frequency calibration method according to the present invention.

Referring to FIG. 4b, this figure is a flowchart of Embodiment 2 of a phase-locked loop frequency calibration method according to the present invention.

A wideband phase-locked loop frequency calibration method provided by this embodiment includes:

S401: Determine, based on a current counting time $T_{CNT}[k]$, whether an error between a current count value FCNT[k] output by a frequency counter and a corresponding current target frequency count value $FCNT_{TARGET}[k]$ is less than a predetermined value, where the frequency counter performs counting for an output frequency of a voltage-controlled oscillator; $T_{CNT}[k]=T_{REF}*R[k]$; $FCNT_{TARGET}[k]= R[k]\times FCW$; the voltage-controlled oscillator is a multi-band voltage-controlled oscillator; and selection of a subband in the multi-band voltage-controlled oscillator is controlled by a digital signal, that is, CT is a digital signal.

$T_{REF}$ is a period of an input reference clock signal of a phase-locked loop; R[k] is a counting time parameter, which is a positive integer changing with a current time k, and k is a positive integer; and FCW is a frequency control word signal, and is a known quantity.

It should be noted that in this embodiment, both a counting time and a target frequency count value are related to R, and therefore, different from those in the prior art, the two quantities are not fixed but are variable, while in the prior art, both the counting time and the target frequency count value are fixed.

The following describes a working principle of the frequency counter.

A function of the frequency counter is to count output signals of the voltage-controlled oscillator within a counting time, and if the counting time is stable, a count value output by the frequency counter may represent an output frequency of the voltage-controlled oscillator.

Figure 5:
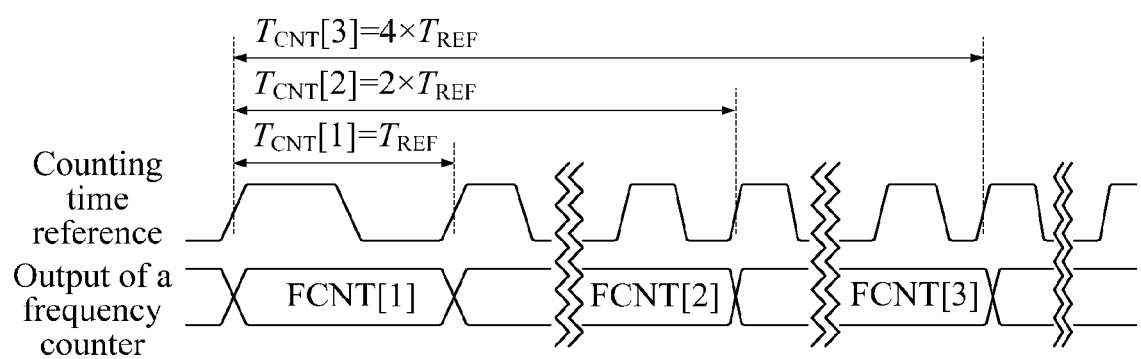
FIG. 5 is a schematic diagram of a working principle of a frequency counter in the prior art.

Referring to FIG. 5, this figure is a schematic diagram of a working principle of a frequency counter in the prior art.

It should be noted that FIG. 5 is a diagram of the working principle of the frequency counter in the prior art, and in the prior art, a counting time $T_{CNT}$ is fixed. However, in this embodiment of the present invention, a counting time of a frequency counter is variable, that is, changed to $T_{CNT}[k]$.

An output signal of a voltage-controlled oscillator is F_VCO, and a frequency of F_VCO is $f_{VCO}$.

It is assumed that the counting time of the frequency counter is $T_{CNT}$, F_VCO signals are counted within $T_{CNT}$, that is, a quantity of F_VCO periods within a time range of $T_{CNT}$ is calculated, and then an ideal output value FCNT' of the frequency counter may be obtained:

$$FCNT' = \frac{T_{CNT}}{T_{CVO}} = T_{CNT} \times f_{VCO} \quad (2)$$

It can be learned from the formula (2) that for any output frequency $f_{VCO}$ of the voltage-controlled oscillator, a count value FCNT' corresponding thereto can be obtained by using the frequency counter. That is, in a case in which the counting time $T_{CNT}$ is stable, the count value FCNT' of the frequency counter may be used to represent the output frequency $f_{VCO}$ of the voltage-controlled oscillator, that is, measurement of the output frequency of the voltage-controlled oscillator is implemented by using the frequency counter:

$$f_{VCO} = FCNT' \times \frac{1}{T_{CNT}} = FCNT' \times f_{CNT} \quad (3)$$

It can be learned from the working principle of the frequency counter shown in FIG. 4 that a count value FCNT output by the frequency counter can only be an integer, and therefore, the count value output by the frequency counter has a quantization error. To obtain an output value of the frequency counter, the formula (2) needs to be revised to:

$$FCNT = \mathrm{ROUND}\left(\frac{T_{CNT}}{T_{VCO}}\right) = \mathrm{ROUND}(T_{CNT} \times f_{VCO}) \quad (4)$$

In the formula (4), a function ROUND indicates a rounding operation.

The output quantization error of the frequency counter is set to $E_{QUAT}$, then $$FCNT'=FCNT+E_{QUAT} \quad (5)$$

It can be learned from FIG. 4 and the formula (4) that a range of the output quantization error of the frequency counter is:

$$\mathrm{ABS}(E_{QUAT})\le 1 \quad (6)$$

In the formula (6), a function ABS indicates an operation of obtaining an absolute value.

It may be obtained according to the formulas (3), (5) and (6) that a frequency measurement error of the voltage-controlled oscillator induced by the quantization error of the frequency counter is that:

$$\begin{aligned}f_{RES} &= \mathrm{ABS}((FCNT - FCNT') \times f_{CNT}) \quad (7)\\ &= \mathrm{ABS}(E_{QUAT} \times f_{CNT})\\ &\le f_{CNT}\end{aligned}$$

That is, the frequency measurement error of the voltage-controlled oscillator induced by the quantization error of the frequency counter is related to the counting time of the frequency counter. It can be learned from the formula (7) that a longer counting time of the frequency counter indicates a smaller frequency measurement error of the voltage-controlled oscillator, that is, the output frequency of the voltage-controlled oscillator reflected by the FCNT output by the frequency counter is closer to an actual output frequency of the voltage-controlled oscillator.

In a phase-locked loop system, generally only an input reference clock CLK_REF is a stable frequency signal, and therefore, the frequency counter generally uses CLK_REF to generate a counting time. That is:

$$T_{CNT}=R\times T_{REF}(R\in \text{positive integer}) \quad (8)$$

That is, the counting time of the frequency counter is generally an integral multiple of the reference clock period. According to the formulas (7) and (8), the following may be obtained:

$$f_{RES} \le f_{CNT} = \frac{f_{REF}}{R}(R \in \text{positive integer}) \quad (9)$$

It should be noted that R in the formulas (8) and (9) is a counting time parameter in the prior art, and in the prior art, R is fixed, but in this embodiment of the present invention, R is variable, that is, R is changed to R[k].

Apparently, a larger value of R in the formula (8) indicates that an obtained count value output by the frequency counter can more accurately reflect an actual frequency of the voltage-controlled oscillator, that is, frequency measurement is more accurate. In terms of an entire calibration process, more accurate frequency measurement of the voltage-controlled oscillator indicates higher calibration precision that is finally obtained. However, a larger value of R also indicates a longer time for frequency measurement. In terms of the entire calibration process, a longer time for frequency measurement for one time indicates a longer time for the entire calibration process, or indicates lower calibration efficiency.

The frequency counter has a quantitative feature, causing that an insurmountable contradictory relationship exists between precision and efficiency of a wideband phase-locked loop frequency calibration mechanism. However, in the method used in this embodiment, a relatively short counting time is used in a subband that has a larger difference with the target frequency value to shorten a calibration time, while in a subband that has a smaller difference with the target frequency value, a relatively long counting time is used to ensure the calibration precision.

S402: If it is determined that the error is 0, use a current working subband as a target subband in which the voltage-controlled oscillator works.

S403: If it is determined that the error is greater than 0 and less than the predetermined value, increase a counting time reference $T_{CNT}[k]$, continue to read a frequency count value obtained by frequency counting performed on a frequency signal that is output in a current working subband by the voltage-controlled oscillator, calculate an error between the newly read frequency count value and $FCNT_{TARGET}[k]$, if the error is 0, use the current working subband as the target subband in which the voltage-controlled oscillator works, and if the error is not 0, continue to compare the error with the predetermined value, continuously increase $T_{CNT}[k]$ until $T_{CNT}[k]$ reaches a maximum value in a value range of $T_{CNT}[k]$, and forcibly enter a next subband in a binary search; and when the binary search is completed, use a subband that corresponds to a minimum value of the error as the target subband in which the voltage-controlled oscillator works.

It can be understood that when the error is zero, it indicates that the target subband is reached, it is unnecessary to continue a further search for a subband, and the current working subband is directly used as the target subband.

It should be noted that the predetermined value is a preset threshold; if the error between the current count value and the current target frequency count value is less than the predetermined value, it indicates that a current working subband is relatively close to the target frequency value, and a more accurate frequency count value needs to be obtained; and precision can be improved by increasing the counting time, and in this case, a measurement time needs to be prolonged.

S404: If it is determined that the error is greater than or equal to the predetermined value, enable a frequency counter to stop counting an output frequency, corresponding to the current working subband, of the voltage-controlled oscillator, and enter a next subband in a binary search.

If it is determined that the error between the current count value and the current target frequency count value is greater than or equal to the predetermined value, it indicates that the current working subband is far from the target frequency value, and there is no need to waste much time on further measurement at the subband; therefore, measurement for the next subband may be directly performed, which can greatly shorten the calibration time.

It should be noted that a step of how to enter the next subband belongs to the prior art, which is specifically as follows:

when the frequency count value is greater than the target frequency count value, selecting, on a binary search path, a subband of which a binary value of a node is less than that of the current working subband, as the next subband; or when the frequency count value is less than the target frequency count value, selecting, on a binary search path, a subband of which a binary value of a node is greater than that of the current working subband, as the next subband.

Figure 7:
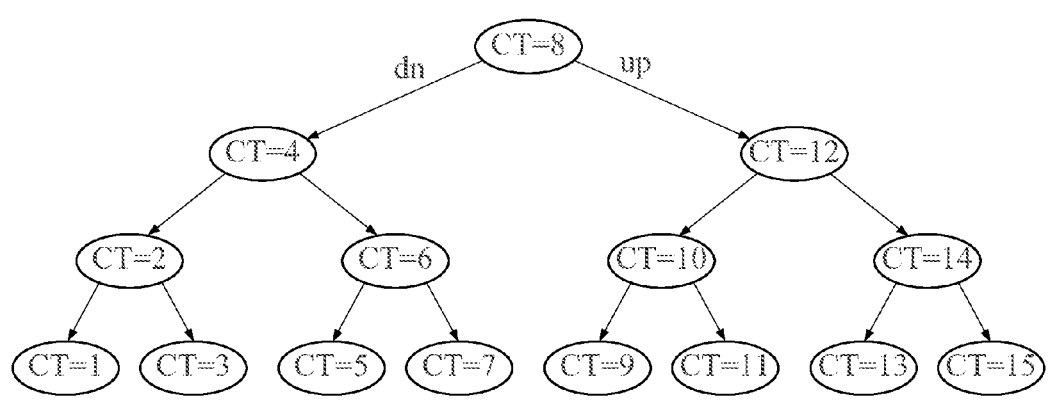
FIG. 7 is a schematic diagram of a binary search algorithm according to the present invention.

It can be seen from FIG. 7 that there are 15 nodes in a binary search tree except a node whose numerical value is 0. On the binary search path, a binary value corresponding to a next node may be greater than or may be less than a binary value corresponding to a previous node. For example, if a current node for which CT=12, there are 2 next nodes after the current node, which are a node for which CT=10 and a node for which CT=14 respectively. If the frequency count value is greater than the target frequency count value, a subband for which CT=10 is selected as a next subband; or if the frequency count value is less than the target frequency count value, a subband for which CT=14 is selected as a next subband.

It can be understood that completion of the binary search means termination of the search path. For example, in FIG. 1, a search is performed to the bottom of a path.

In the wideband phase-locked loop frequency calibration method provided by this embodiment, both a counting time and a target frequency count value are set to be variable, while in the prior art, a counting time and a target frequency count value are fixed. Because a frequency calibration time and frequency calibration precision are contradictory, and there is relatively large difference between many subbands and a target frequency value, it is unnecessary to spend a long time in improving measurement precision for some subbands, but a long time is spent in improving measurement precision for a subband close to the target frequency value, thereby obtaining a calibrated accurate frequency. In this embodiment, a measured error is compared with a preset value, so as to control whether to increase a counting time, thereby effectively controlling the calibration time. Such a dynamic calibration method can effectively shorten the calibration time on the whole.

Method Embodiment 3

Figure 6:
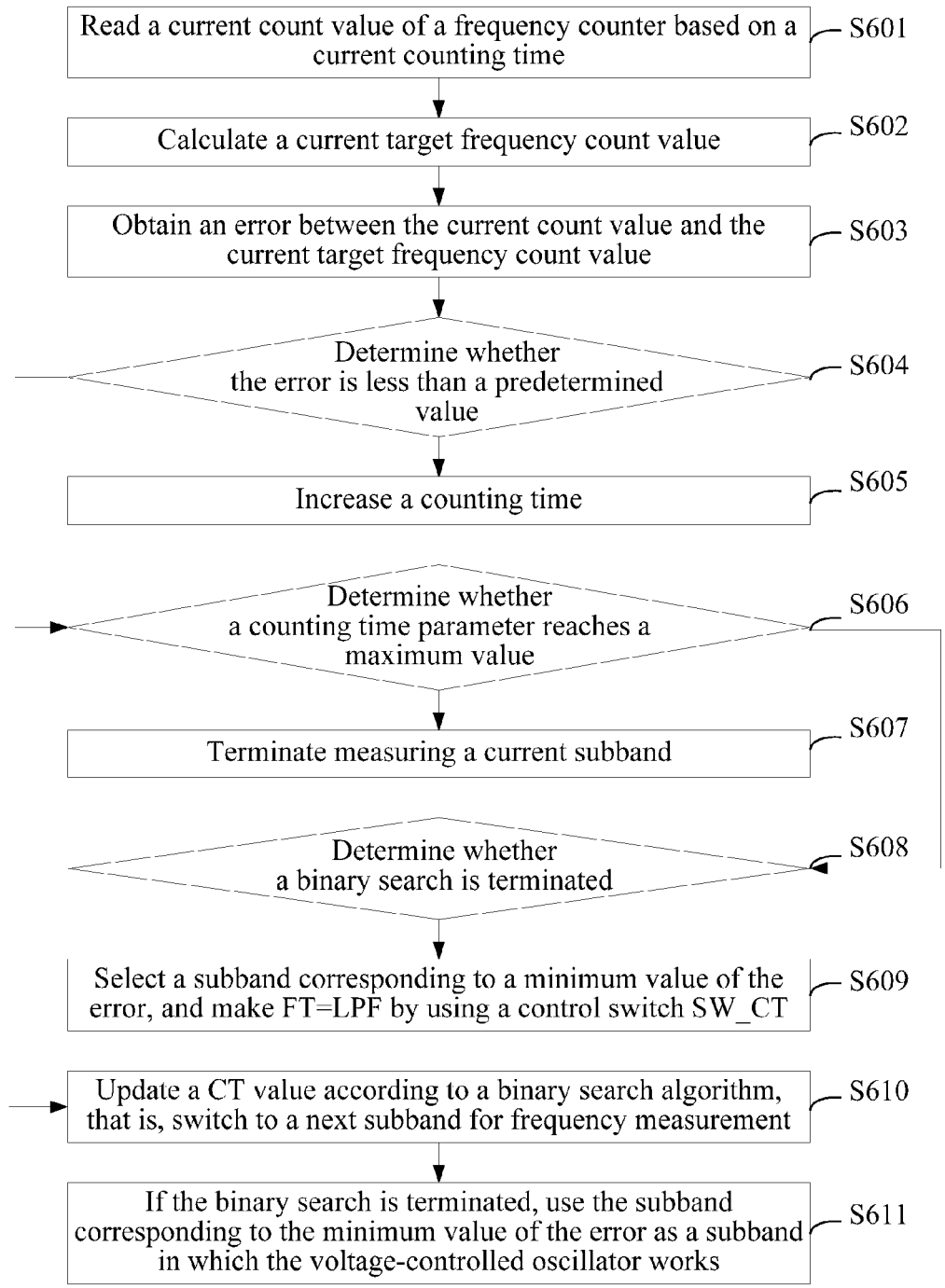
FIG. 6 is a flowchart of Embodiment 3 of a phase-locked loop frequency calibration method according to the present invention.

Referring to FIG. 6, this figure is a flowchart of Embodiment 3 of a phase-locked loop frequency calibration method according to the present invention.

This embodiment introduces a most complete calibration process.

Method embodiment 1 has already introduced that R[k] is a positive integer. In an actual application, for ease of implementation, R[k] may be set to a form of an integral power of 2. In a logic circuit, only a shift operation needs to be performed to implement calculation of an integral power of 2, which can greatly reduce consumption of chip resources. Therefore, in this embodiment, R[k] is implemented as an integral power of 2.

S601: Read a current count value FCNT[k] of a frequency counter based on a current counting time $T_{CNT}[k]$.

S602: Calculate a current target frequency count value $FCNT_{TARGET}[k]$.

S603: Obtain an error $FCNT_{ERR} = FCNT[k] - FCNT_{TARGET}[k]$ between FCNT[k] and $FCNT_{TARGET}[k]$.

S604: Determine whether the error $FCNT_{ERR}$ is less than a predetermined value, if yes, perform S605, and if not, perform S607.

S605: Increase a counting time, that is, increase k by 1, and change $T_{CNT}[k]$ to $T_{CNT}[k+1]$.

It should be noted that in this case, all numerical values related to k change as k changes.

S606: Determine whether R[k] reaches a maximum value, if yes, forcibly enter a next subband in a binary search, that is, perform S607.

Because R[k] changes as k changes, and $R[k]=2^{k-1}$, a maximum value of R[k] is $R_{max}$, and when $A=f_{REF}/f_{RES}$ is an integral power of 2, $R_{max}=A$; and when A is not an integral power of 2, a value of $R_{max}$ is set to a minimum value in integral powers of 2 that are greater than A, where $f_{REF}=1/T_{REF}$; and $f_{RES}$ is target precision of a phase-locked loop, and is a known quantity.

S607: Terminate measuring a current working subband.

S608: Determine whether the binary search is completed, if yes, perform S609, and if not, perform S610.

Completion of the binary search means that a search is performed to the bottom, that is, a lowest layer of a binary search tree.

S609: Select a subband corresponding to a minimum value of the error $FCNT_{ERR}$, and make FT=LPF by using a control switch SW_CT.

S610: Update a CT value according to a binary search algorithm, that is, switch to a next subband for frequency measurement.

S611: If the binary search is completed, use the subband corresponding to the minimum value of the error as a subband in which the voltage-controlled oscillator works.

To better understand the method provided by this embodiment, the following describes the method with reference to a specific instance, and description is provided by using an example in which NCT is still equal to 4, that is, a voltage-controlled oscillator has 16 frequency bands.

Referring to FIG. 7, this figure is a schematic diagram of a binary search algorithm according to the present invention.

The algorithm is used starting from an intermediate subband (CT=1000), that is, starting from a subband for which CT=8.

The frequency counter performs counting for an output frequency of a voltage-controlled oscillator in the subband, to obtain a count value $(FCNT)_{CT=8}$, and it is assumed that a count value corresponding to $f_{TARGET}$ is $FCNT_{TARGET}$, where if $$(FCNT)_{CT=8} < FCNT_{TARGET} \qquad (10)$$

it can be learned from the formula (10) that a current count value is less than a target frequency value.

Therefore, a subband to be measured is adjusted to subband for which CT=12 according to a binary search algorithm, that is, an uplink search (up) path in FIG. 7.

In the subband for which CT=12, the foregoing measurement, comparison, and search process are repeated until a search is performed to the bottom, that is an odd-numbered layer, in FIG. 7.

In this search process, a subband for which CT=0 is not measured. Generally, in a design of a voltage-controlled oscillator, a certain margin is designed, that is, a subband for which CT=0 is designed as redundancy out of a requirement range of a system, and the subband may not be measured, so as to save a calibration time.

For each node, that is, each subband, on a binary search path, a frequency of the voltage-controlled oscillator in the corresponding subband is measured by using the frequency counter, a difference value between a corresponding count value and a target frequency count value is stored, and a subband in which a finally measured difference value is the smallest is used as a selected subband.

For the voltage-controlled oscillator shown in FIG. 7, which is controlled by a 4-bit word, that is, has 16 frequency bands, measurement needs to be performed 4 times in total. More subbands requires a longer measurement time.

A target frequency value $f_{TARGET}$ of the phase-locked loop corresponds to one count value $FCNT_{TARGET}$ of the frequency counter, and it can be obtained according to the formula (2) and the formula (8) that:

$$\begin{aligned} FCNT_{TARGET} &= T_{CNT} \times f_{TARGET} \qquad (11) \\ &= R \times \frac{f_{TARGET}}{f_{REF}} \\ &= R \times FCW \end{aligned}$$

That is, a target frequency count value of the frequency counter can be directly obtained by using a frequency control word signal FCW of the phase-locked loop.

Figure 8:
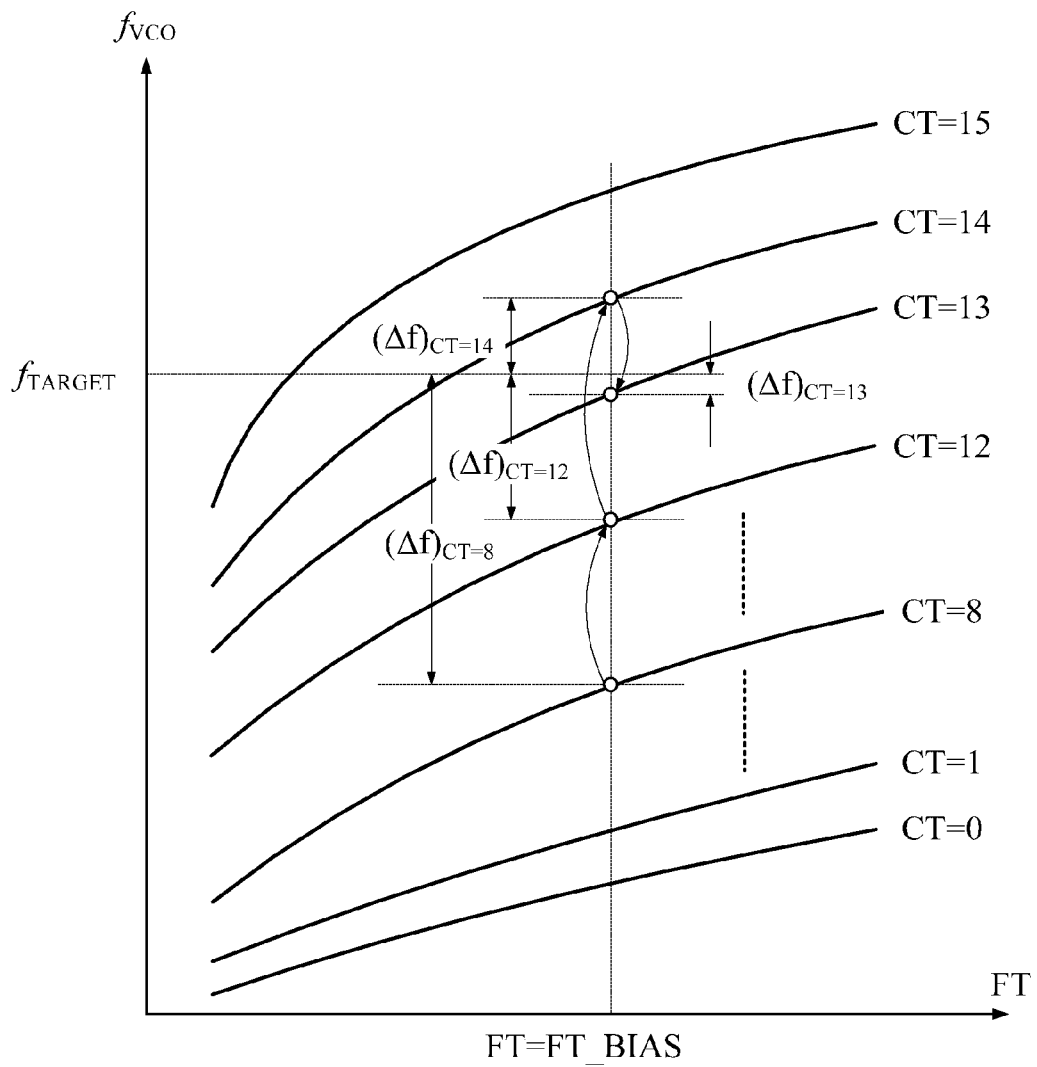
FIG. 8 is a schematic diagram of a subband search according to the present invention.

A corresponding subband that is theoretically optimum in FIG. 7 is a subband for which CT=13. Referring to FIG. 8, this figure is a schematic diagram of a subband search.

In the figure, an arc shows a path of a binary search, that is, CT=8→CT=12→CT=14→CT=13. For each subband in the foregoing path, a frequency counter performs counting for an output frequency, corresponding to the subband, of the voltage-controlled oscillator, compares a count value with a target count value, and determines a search path.

It can be seen from FIG. 8 that a difference value between a count value corresponding to each subband and a target count value is different. In an example in FIG. 8, $(\Delta f)_{CT=0, 1, 2, \ldots}$ indicates a difference value between an output frequency, corresponding to each subband (CT=0, 1, 2, ...), of a voltage-controlled oscillator and a target frequency value.

It can be seen from FIG. 8 that:

$$(\Delta f)_{CT=8} > (\Delta f)_{CT=12} > (\Delta f)_{CT=13} > (\Delta f)_{CT=14} \qquad (12)$$

In subbands for which CT=8 and CT=12, it is measured that frequencies are far from the target frequency value, that is, $(\Delta f)_{CT=8}$ and $(\Delta f)_{CT=12}$ are relatively large, and therefore, only relative value relationships between the frequencies and the target frequency value need to be determined, without a need to accurately measure the frequencies.

However, in subbands for which CT=13 and CT=14, it is measured that frequencies are relatively close to the target frequency value, and therefore, it needs to accurately measure the frequencies, and select a final calibration result according to a measurement result.

It should be noted that in this embodiment, description is made by using 16 frequency bands as an example. It can be understood that when there are more subbands, advantages of the method provided by this embodiment of the present invention are more obvious, that is, a longer more calibration time is saved.

That is, a quantity of subbands of the multi-band voltage-controlled oscillator is $N_{CT}=2^m$, where m is a positive integer. That is, the quantity of the subbands may be an integral power of 2.

It can be understood that because k is a positive integer, in $R[k]=2^{k-1}$, a minimum value of k is 1, that is, $R[1]=2^0=1$. A larger value of k indicates higher frequency measurement precision of the frequency counter, but a corresponding time is longer; and a smaller value of k indicates lower frequency measurement precision of the frequency counter, but a corresponding time is shorter.

Figure 9:
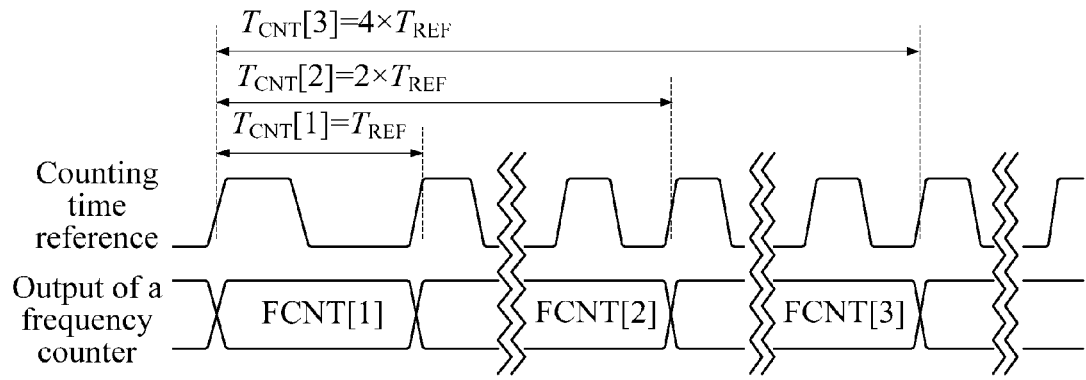
FIG. 9 is a schematic diagram of a working principle of a frequency counter according to the present invention.

The following describes, with reference to FIG. 9, that a counting time in dynamic frequency calibration provided by the present invention is dynamically adjusted.

Because the value of k is variable, in this embodiment, one frequency counter may be used to perform counting and measure a frequency in multiple different counting times, without a need of using multiple frequency counters or a need of performing measurement multiple times.

It can be seen from FIG. 9 that $T_{CNT}[1]=T_{REF}$; $T_{CNT}[2]=2*T_{REF}$; and $T_{CNT}[3]=4*T_{REF}$.

It should be noted that the method provided by the foregoing embodiment of the present invention is applicable to an analog integer-N phase-locked loop, an analog fractional-N phase-locked loop, a digital integer-N phase-locked loop, and a digital fractional-N phase-locked loop.

According to the frequency calibration method provided by this embodiment, a counting time of a frequency counter corresponding to each subband is dynamically variable, a relatively short counting time is used in a subband that has a larger difference value with a target frequency value, so that rapid determining can be implemented, and a relatively longer counting time is used in a subband that has a smaller difference value with the target frequency value, so that calibration precision can be ensured. Because a counting time parameter is in a form of an integral power of 2, there is no additional consumption of hardware, and a calibration method is easily implemented on a chip.

Based on a phase-locked loop frequency calibration method provided by the foregoing embodiment, an embodiment of the present invention further provides a phase-locked loop frequency calibration device, which is described in detail below with reference to the accompanying drawing.

Device Embodiment 1

Figure 10:
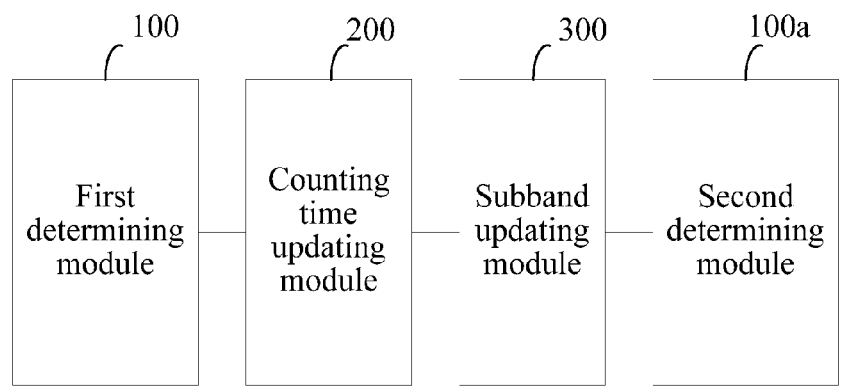
FIG. 10 is a schematic diagram of Embodiment 1 of a phase-locked loop frequency calibration device according to the present invention.

Referring to FIG. 10, this figure is a schematic diagram of Embodiment 1 of a phase-locked loop frequency calibration device according to the present invention.

A wideband phase-locked loop calibration device provided by this embodiment includes: a first determining module 100, a counting time updating module 200, a subband updating module 300, and a second determining module 100a.

The first determining module 100 is configured to determine, based on a current counting time $T_{CNT}[k]$, whether an error between a current count value FCNT[k] output by a frequency counter and a corresponding current target frequency count value $FCNT_{TARGET}[k]$ is less than a predetermined value, where the frequency counter performs counting for an output frequency of a voltage-controlled oscillator; the voltage-controlled oscillator is a multi-band voltage-controlled oscillator; and selection of a subband in the multi-band voltage-controlled oscillator is controlled by a digital signal; and $T_{CNT}[k]=T_{REF}*R[k]$; and $FCNT_{TARGET}[k]=R[k] \times$ FCW, where $T_{REF}$ is a period of a reference clock input to a phase-locked loop; R[k] is a counting time parameter, which is a positive integer changing with a current time k, and k is a positive integer; and FCW is a frequency control word signal of the phase-locked loop, and is a known quantity.

It should be noted that in this embodiment, both a counting time and a target frequency count value are related to R, and therefore, different from those in the prior art, the two quantities are not fixed but are variable; while in the prior art, both a counting time and a target frequency count value are fixed.

A reason why the counting time and the target frequency count value are set to be variable in this embodiment is that for a wideband voltage-controlled oscillator, for most sub-bands on a binary search path, only a relative value relationship between a count value read by a frequency counter and a target frequency needs to be determined, without a need to obtain an accurate output frequency of the voltage-controlled oscillator. However, for a few subbands close to a target frequency value, an accurate output frequency of the voltage-controlled oscillator needs to be learned, and a difference value between the count value read by the frequency counter and the target frequency value is used as a basis for selection of a sub frequency, that is, measurement precision affects a final result of frequency calibration.

Because a compromise relationship exists between frequency measurement precision and a measurement time, in order to shorten a frequency calibration time, a requirement on measurement precision can be lowered for a subband in which only a frequency value needs to be determined. In this way, measurement times in these subbands can be shortened. However, in a sub frequency with a high requirement on measurement precision, measurement precision is ensured to prolong a measurement time. Therefore, a method for dynamically adjusting frequency measurement precision in this embodiment can improve an effect of frequency calibration without affecting calibration precision.

The following describes a working principle of the frequency counter.

A function of the frequency counter is to count output signals of the voltage-controlled oscillator within a counting time, and if the counting time is stable, a count value output by the frequency counter may represent an output frequency of the voltage-controlled oscillator.

The counting time updating module 200 is configured to: when the first determining module 100 determines that the error is less than the predetermined value, increase the counting time and continue to read the count value output by the frequency counter.

It should be noted that the predetermined value is a preset threshold; if the error between the current count value and the current target frequency count value is less than the predetermined value, it indicates that a current working subband is relatively close to the target frequency value, and a more accurate frequency count value needs to be obtained; and precision can be improved by increasing the counting time, and in this case, a measurement time needs to be prolonged.

The subband updating module 300 is configured to: when the first determining module 100 determines that the error is greater than or equal to the predetermined value, enable the frequency counter to stop counting an output frequency, corresponding to the current working subband, of the voltage-controlled oscillator, and enter a next subband of a binary search.

If it is determined that the error between the current count value and the current target frequency count value is greater than or equal to the predetermined value, it indicates that the current working subband is far from the target frequency value, and there is no need to waste much time on further measurement in the sub frequency; therefore, measurement for the next subband may be directly performed, which can greatly shorten the calibration time.

The second determining module 100a is configured to determine that the binary search is completed, and use a subband corresponding to the minimum value of the error as a subband in which the voltage-controlled oscillator works.

Figure 1:
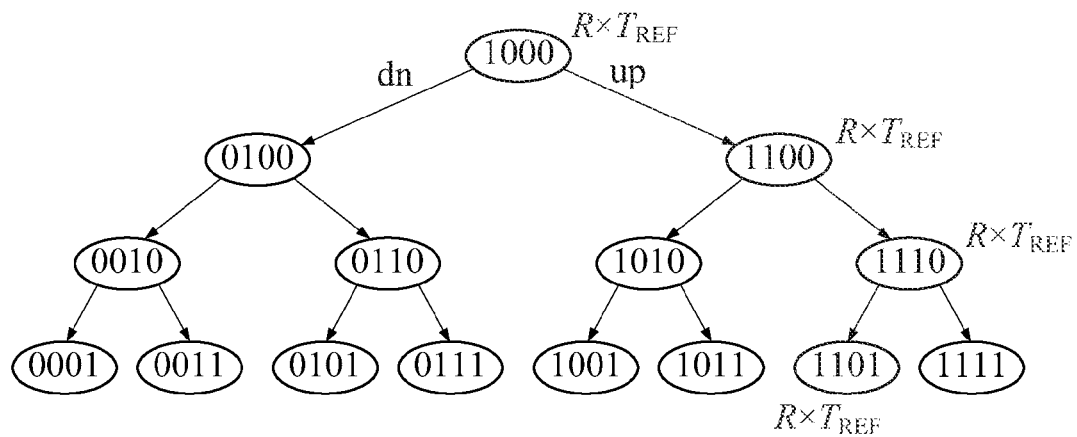
FIG. 1 is a schematic diagram of a binary search method in the prior art.

It should be noted that completion of the binary search means that a search of subbands on the search path is completed, for example, a search is performed to the bottom in FIG. 1.

In the wideband phase-locked loop frequency calibration device provided by this embodiment, both a counting time and a target frequency count value are set to be variable, while in the prior art, a counting time and a target frequency count value are fixed. Because a frequency calibration time and frequency calibration precision are contradictory, and there is relatively large difference between many subbands and a target frequency value, it is unnecessary to spend a long time in improving measurement precision for some subbands, but a long time is spent in improving measurement precision for a subband close to the target frequency value, thereby obtaining a calibrated accurate frequency. In this embodiment, a measured error is compared with a preset value, so as to control whether to increase a counting time, thereby effectively controlling the calibration time. Such a dynamic calibration method can effectively shorten the calibration time on the whole.

Device Embodiment 2

Figure 11:
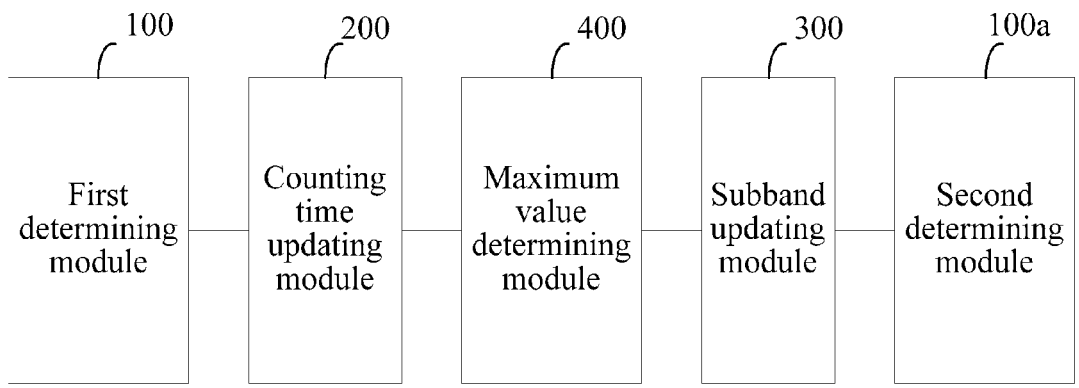
FIG. 11 is a schematic diagram of Embodiment 2 of a phase-locked loop frequency calibration device according to the present invention.

Referring to FIG. 11, this figure is a schematic diagram of Embodiment 2 of a wideband phase-locked loop frequency calibration device according to the present invention.

R[k] is a positive integer. In an actual application, for ease of implementation, R[k] may be set to a form of an integral power of 2. In a logic circuit, only a shift operation needs to be performed to implement calculation of an integral power of 2, which can greatly reduce consumption of chip resources. Therefore, in this embodiment, R[k] is implemented as an integral power of 2.

That is, $R[k]=2^{k-1}$; $T_{CNT}[k]=T_{REF}*2^{k-1}$; $FCNT_{TARGET}[k]=2^{k-1} \times FCW$; and a maximum value of R[k] is: $R_{max}=2^{k-1} \geq f_{REF}/f_{RES}$, where $f_{REF}$ is a frequency of an input reference clock of a phase-locked loop, where $f_{REF}=1/T_{REF}$; and $f_{RES}$ is target precision of the phase-locked loop, and is a known quantity.

The wideband phase-locked loop frequency calibration device provided by this embodiment may further include: a maximum value determining module 400, where the maximum value determining module 400 is configured to determine whether R[k] reaches a maximum value, and if yes, a subband updating module 300 forcibly enters a next subband of a binary search.

According to the frequency calibration device provided by this embodiment, a counting time of a frequency counter corresponding to each subband is dynamically variable, a relatively short counting time is used in a subband that has a larger difference value with a target frequency value, so that rapid determining can be implemented, and a relatively longer counting time is used in a subband that has a smaller difference value with the target frequency value, so that calibration precision can be ensured. Because a counting time parameter is in a form of an integral power of 2, there is no additional consumption of hardware, and the calibration device is easily implemented on a chip.

Based on a phase-locked loop frequency calibration method provided by the foregoing embodiment, an embodiment of the present invention further provides a phase-locked loop frequency calibration system, which is described in detail below with reference to the accompanying drawing.

System Embodiment 1

Figure 11A:
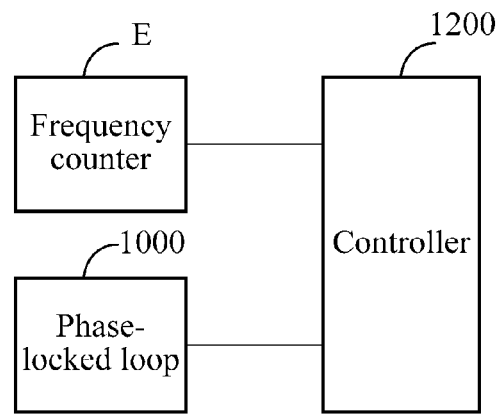
FIG. 11a is a schematic diagram of Embodiment 1 of a phase-locked loop frequency calibration system according to the present invention.

Referring to FIG. 11a, this figure is a schematic diagram of Embodiment 1 of a phase-locked loop frequency calibration system according to the present invention.

The phase-locked loop frequency calibration system provided by this embodiment includes: a phase-locked loop 1000, a frequency counter E, and a controller 1200, where the phase-locked loop 1000 includes a multi-band voltage-controlled oscillator.

The phase-locked loop 1000 is configured to control, according to an input reference clock signal, the voltage-controlled oscillator to output a frequency signal.

The frequency counter E is configured to perform, within a counting time $T_{CNT}[k]$, frequency counting on the frequency signal that is output in a current working subband by the voltage-controlled oscillator, to obtain a frequency count value FCNT[k], where the current working subband corresponds to a binary value of a current node in a binary search tree.

It can be understood that for a multi-band voltage-controlled oscillator, a current working subband thereof refers to a binary value corresponding to a current node in a binary search tree. For example, for a voltage-controlled oscillator with 16 frequency bands, a binary value corresponding to a node thereof for which CT=12 is 1100.

It should be noted that for the binary search tree, an initial search starts from a node corresponding to an intermediate subband. For example, for the voltage-controlled oscillator with 16 frequency bands, a node from which an initial search starts is a node for which CT=8 (a corresponding binary value is 1000).

The controller 1200 is configured to calculate an error between FCNT[k] and a target frequency count value $FCNT_{TARGET}[k]$, compare an absolute value of the error with a predetermined value, dynamically adjust $T_{CNT}[k]$ in a value range of $T_{CNT}[k]$ according to a comparison result, and determine, in combination with a binary search algorithm, a target subband in which the voltage-controlled oscillator works.

A reason why a counting time and the target frequency count value are set to be variable in this embodiment is that for a wideband voltage-controlled oscillator, for most subbands on a binary search path, only a relative value relationship between a count value read by a frequency counter and a target frequency needs to be determined, without a need to obtain an accurate output frequency of the voltage-controlled oscillator. However, for a few subbands close to a target frequency value, an accurate output frequency of the voltage-controlled oscillator needs to be learned, and a difference value between the count value read by the frequency counter and the target frequency value is used as a basis for selection of a sub frequency, that is, measurement precision affects a final result of frequency calibration.

Because a compromise relationship exists between frequency measurement precision and a measurement time, in order to shorten a frequency calibration time, a requirement on measurement precision can be lowered for a subband in which only a frequency value needs to be determined. In this way, measurement times in these subbands can be shortened.

However, in a sub frequency with a high requirement on measurement precision, measurement precision is ensured to lengthen a measurement time. Therefore, a method for dynamically adjusting frequency measurement precision in this embodiment can improve an effect of frequency calibration without affecting calibration precision.

According to the phase-locked loop frequency calibration system provided by this embodiment, both a counting time and a target frequency count value are set to be variable, while in the prior art, a counting time and a target frequency count value are fixed. Because a frequency calibration time and frequency calibration precision are contradictory, and there is relatively large difference between many subbands and a target frequency value, it is unnecessary to spend a long time in improving measurement precision for some subbands, but a long time is spent in improving measurement precision for a subband close to the target frequency value, thereby obtaining a calibrated accurate frequency. In this embodiment, a measured error is compared with a preset value, so as to control whether to adjust a counting time, thereby effectively controlling a calibration time. Such a dynamic calibration method can effectively shorten the calibration time on the whole.

System Embodiment 2

Figure 12:
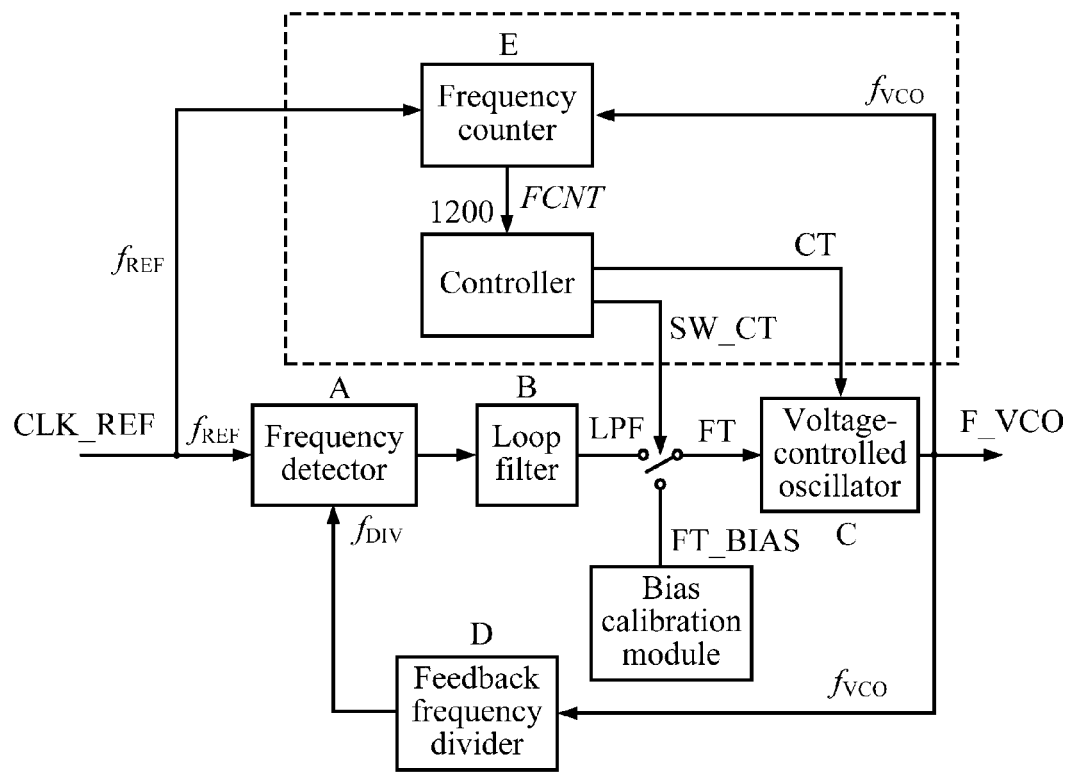
FIG. 12 is a schematic diagram of Embodiment 2 of a phase-locked loop frequency calibration system according to the present invention.

Referring to FIG. 12, this figure is a schematic diagram of Embodiment 2 of a phase-locked loop frequency calibration system according to the present invention.

A phase-locked loop in the phase-locked loop frequency calibration system provided by this embodiment includes: a frequency detector A, a loop filter B, a voltage-controlled oscillator C, and a feedback frequency divider D.

The voltage-controlled oscillator C is a multi-band voltage-controlled oscillator, and selection of a subband in the multi-band voltage-controlled oscillator is controlled by a digital signal.

The subband corresponds to a binary value corresponding to a node in a binary search tree.

The frequency detector A is configured to compare a target frequency value with an acquired output frequency of the voltage-controlled oscillator C, to obtain a frequency error, output an error voltage that is proportional to the frequency error, and output the error voltage to the loop filter B.

The loop filter B is configured to filter out a high frequency signal in the error voltage, and output a control voltage to the voltage-controlled oscillator C.

The voltage-controlled oscillator C is configured to output a target frequency value at the control voltage.

The frequency counter E is configured to perform counting, in a current counting time $T_{CNT}[k]$, for an output frequency of the voltage-controlled oscillator C, and output a current count value FCNT[k] to a controller 1200, where $$T_{CNT}[k]=T_{REF}*R[k]; \text{ and}$$

$T_{REF}$ is a period of a reference clock signal input to a phase-locked loop; $R[k]$ is a counting time parameter, which is a positive integer changing with a current time k, and k is a positive integer; and FCW is a frequency control word signal of the phase-locked loop, and is a known quantity.

It should be noted that in this embodiment, both a counting time and a target frequency count value are related to R, and therefore, different from those in the prior art, the two quantities are not fixed but are variable, while in the prior art, both the counting time and the target frequency count value are fixed.

A reason why a counting time and the target frequency count value are set to be variable in this embodiment is that for a wideband voltage-controlled oscillator, for most subbands on a binary search path, only a relative value relationship between a count value read by a frequency counter and a target frequency needs to be determined, without a need to obtain an accurate output frequency of the voltage-controlled oscillator. However, for a few subbands close to a target frequency value, an accurate output frequency of the voltage-controlled oscillator needs to be learned, and a difference between the count value read by the frequency counter and the target frequency value is used as a basis for selection of a sub frequency, that is, measurement precision affects a final result of frequency calibration.

Because a compromise relationship exists between frequency measurement precision and a measurement time, in order to shorten a frequency calibration time, a requirement on measurement precision can be lowered for a subband in which only a frequency value needs to be determined. In this way, measurement times in these subbands can be shortened. However, in a sub frequency with a high requirement on measurement precision, measurement precision is ensured to prolong a measurement time. Therefore, a method for dynamically adjusting frequency measurement precision in this embodiment can improve an effect of frequency calibration without affecting calibration precision.

The following describes a working principle of the frequency counter.

A function of the frequency counter is to count output signals of the voltage-controlled oscillator within a counting time, and if the counting time is stable, a count value output by the frequency counter may represent an output frequency of the voltage-controlled oscillator.

The controller 1200 is configured to dynamically adjust $T_{CNT}[k]$ in a value range of $T_{CNT}[k]$ according to a comparison result, and determine, in combination with a binary search algorithm, a target subband in which the voltage-controlled oscillator works, which is specifically as follows:

if it is determined that the error is 0, using a current working subband as a target subband in which the voltage-controlled oscillator works;

if it is determined that the error is greater than 0 and less than a predetermined value, increasing a counting time reference $T_{CNT}[k]$, continuing to read a frequency count value obtained by frequency counting performed on a frequency signal that is output in a current working subband by the voltage-controlled oscillator, calculating an error between the newly read frequency count value and $FCNT_{TARGET}[k]$, if the error is 0, using the current working subband as the target subband in which the voltage-controlled oscillator works, and if the error is not 0, continuing to compare the error with the predetermined value, continuously increasing $T_{CNT}[k]$ until $T_{CNT}[k]$ reaches a maximum value in the value range of $T_{CNT}[k]$, and forcibly entering a next subband in a binary search; and when the binary search is completed, using a subband that corresponds to a minimum value of the error as the target subband in which the voltage-controlled oscillator works, where $$FCNT_{TARGET}[k]=R[k] \times FCW; \text{ and}$$

it can be seen from expressions regarding $T_{CNT}[k]$ and $FCNT_{TARGET}[k]$ that both $T_{CNT}[k]$ and $FCNT_{TARGET}[k]$ change with k, and are not fixed; and if it is determined that the error is greater than or equal to the predetermined value, stopping counting an output frequency, corresponding to the current working subband, of the voltage-controlled oscillator, and entering a next subband in a binary search.

It should be noted that a step of how to enter the next subband belongs to the prior art, which is specifically as follows:

The entering, by the controller, a next subband of a binary search, which is specifically as follows:

when the frequency count value is greater than the target frequency count value, selecting, on a binary search path, a subband of which a binary value of a node is less than that of the current working subband, as the next subband; or when the frequency count value is less than the target frequency count value, selecting, on a binary search path, a subband of which a binary value of a node is greater than that of the current working subband, as the next subband.

It can be seen from FIG. 7 that there are 15 nodes in a binary search tree except a node whose numerical value is 0. On the binary search path, a binary value corresponding to a next node may be greater than or may be less than a binary value corresponding to a previous node. For example, if a current node for which CT=12, there are 2 next nodes after the current node, which are a node for which CT=10 and a node for which CT=14 respectively. If the frequency count value is greater than the target frequency count value, a subband for which CT=10 is selected as a next subband; or if the frequency count value is less than the target frequency count value, a subband for which CT=14 is selected as a next subband.

It should be noted that completion of the binary search means termination of the search path, that is, a search is performed to the last subband on the path, for example, the bottom in FIG. 1.

It should be noted that the predetermined value is a preset threshold; if the error between the current count value and the current target frequency count value is less than the predetermined value, it indicates that a current working subband is relatively close to the target frequency value, and a more accurate frequency count value needs to be obtained; and precision can be improved by increasing the counting time, and in this case, a measurement time needs to be prolonged.

If it is determined that the error between the current count value and the current target frequency count value is greater than or equal to the predetermined value, it indicates that the current working subband is far from the target frequency value, and there is no need to waste much time on further measurement at the sub frequency; therefore, measurement for the next subband may be directly performed, which can greatly shorten the calibration time.

A calibration bias module in FIG. 12 is the prior art, configured to: during initialization, control that FT=FT_BIAS, and set CT to an intermediate subband in a binary search tree. When there are 16 frequency bands, a node from which an initial search starts is a node for which CT=8 (a corresponding binary value is 1000).

According to the phase-locked loop frequency calibration system provided by this embodiment, both a counting time and a target frequency count value are set to be variable, while in the prior art, a counting time and a target frequency count value are fixed. Because a frequency calibration time and frequency calibration precision are contradictory, and there is relatively large difference between many subbands and a target frequency value, it is unnecessary to spend a long time in improving measurement precision for some subbands, but a long time is spent in improving measurement precision for a subband close to the target frequency value, thereby obtaining a calibrated accurate frequency. In this embodiment, a measured error is compared with a preset value, so as to control whether to increase a counting time, thereby effectively controlling the calibration time. Such a dynamic calibration method can effectively shorten the calibration time on the whole.

System Embodiment 3

R[k] is a positive integer. In an actual application, for ease of implementation, R[k] may be set to a form of an integral power of 2. In a logic circuit, only a shift operation needs to be performed to implement calculation of an integral power of 2, which can greatly reduce consumption of chip resources. Therefore, in this embodiment, R[k] is implemented as an integral power of 2.

$$R[k]=2^{k-1};$$

$$T_{CNT}[k]=T_{REF}*R[k]=T_{REF}*2^{k-1};$$

$$FCNT_{TARGET}[k]=2^{k-1} \times FCW; \text{ and}$$

a maximum value of R[k] is $R_{max}$ and when $A=f_{REF}/f_{RES}$ is an integral power of 2, $R_{max}=A$; and when A is not an integral power of 2, $R_{max}$ is set to a minimum value in integral powers of 2 that are greater than A, where $f_{REF}=1/T_{REF}$; and $f_{RES}$ is target precision of a phase-locked loop, and is a known quantity.

It should be noted that a phase-locked loop provided by the foregoing embodiment of the present invention may be of various types, such as an analog integer-N phase-locked loop, an analog fractional-N phase-locked loop, a digital integer-N phase-locked loop, and a digital fractional-N phase-locked loop.

For example, an analog integer-N phase-locked loop is shown in FIG. 12, that is, a frequency detector A, a loop filter B, a voltage-controlled oscillator C, and a feedback frequency divider D all work in an analog signal domain, and an FCW of the phase-locked loop is a positive integer.

Figure 12A:
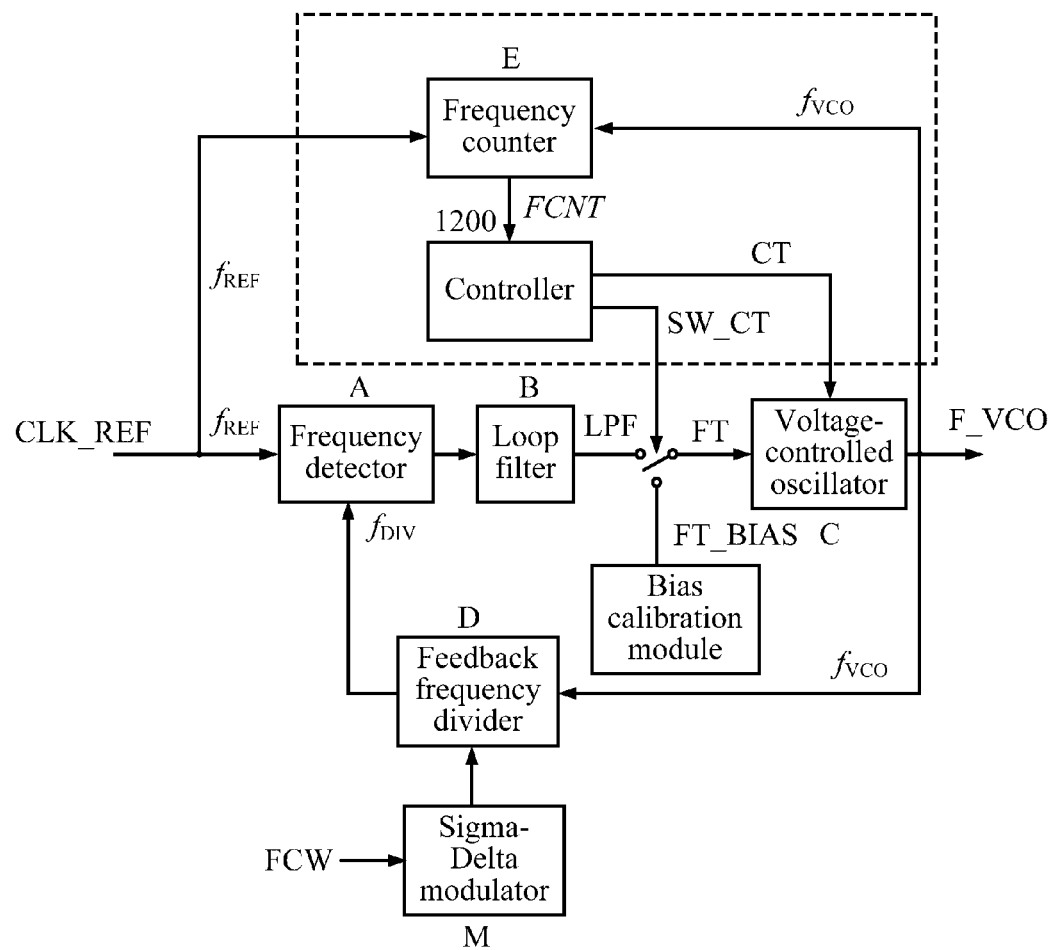
FIG. 12a is a schematic diagram of a phase-locked loop frequency calibration system in a case in which the phase-locked loop frequency calibration system is an analog fractional-N phase-locked loop according to the present invention.

In addition, referring to FIG. 12a, the phase-locked loop in the present invention may also be an analog fractional-N phase-locked loop (Fractional-N PLL), that is, a frequency detector A, a loop filter B, a voltage-controlled oscillator C, and a feedback frequency divider D all work in an analog signal domain, and an FCW of the phase-locked loop is a positive rational number.

Compared with FIG. 12, FIG. 12a additionally has a Sigma-Delta modulator M.

Figure 12B:
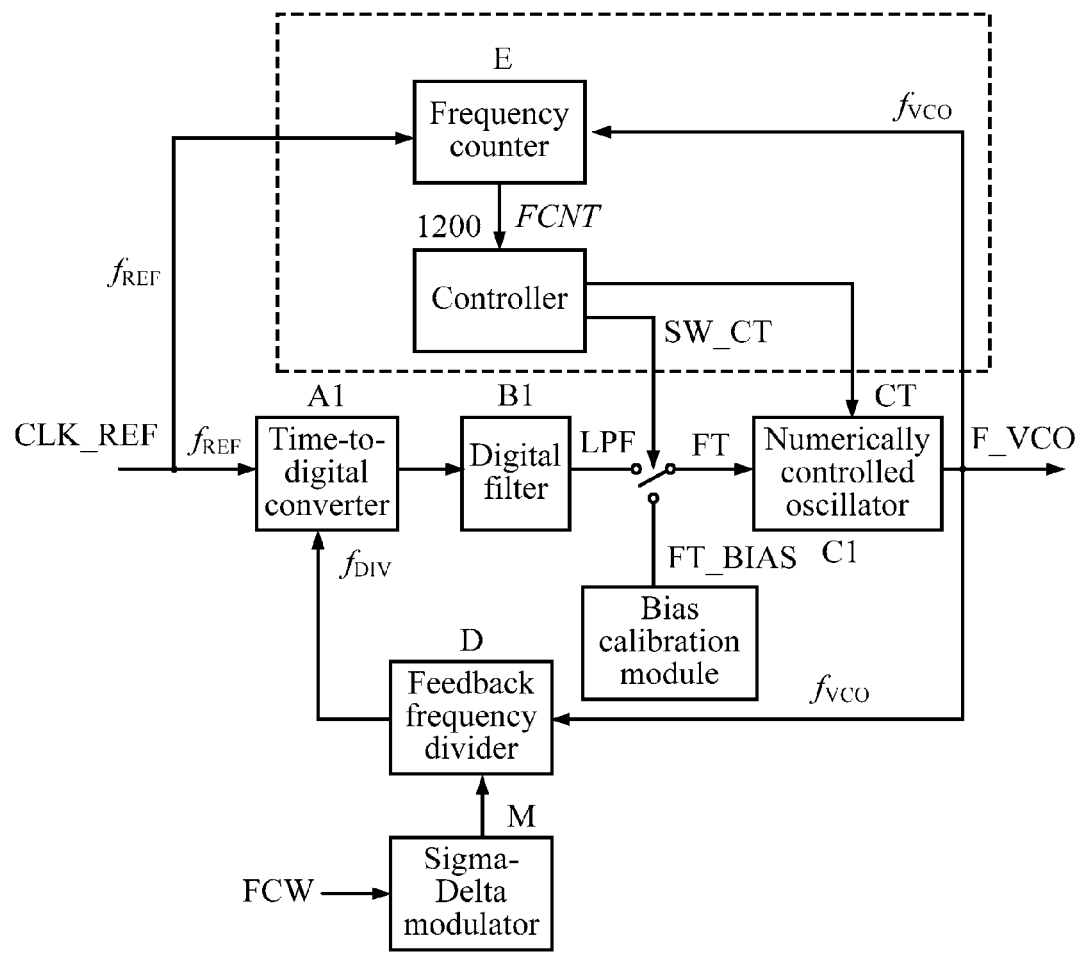
FIG. 12b is a schematic diagram of a phase-locked loop frequency calibration system in a case in which the phase-locked loop frequency calibration system is a digital fractional-N phase-locked loop according to the present invention.

In addition, referring to FIG. 12b, the phase-locked loop in the present invention may also be a digital integer-N phase-locked loop (Digital Integer-N PLL), that is, a time-to-digital converter A1 in the phase-locked loop converts phase information into a digital signal, digitalized phase error information is processed by using a digital filter B1, and a numerically controlled oscillator C1 is controlled by using the digital signal to output an expected frequency signal. The frequency control word FCW of the phase-locked loop is a positive rational number.

Compared with FIG. 12, FIG. 12b also additionally has a Sigma-Delta modulator M.

Figure 12C:
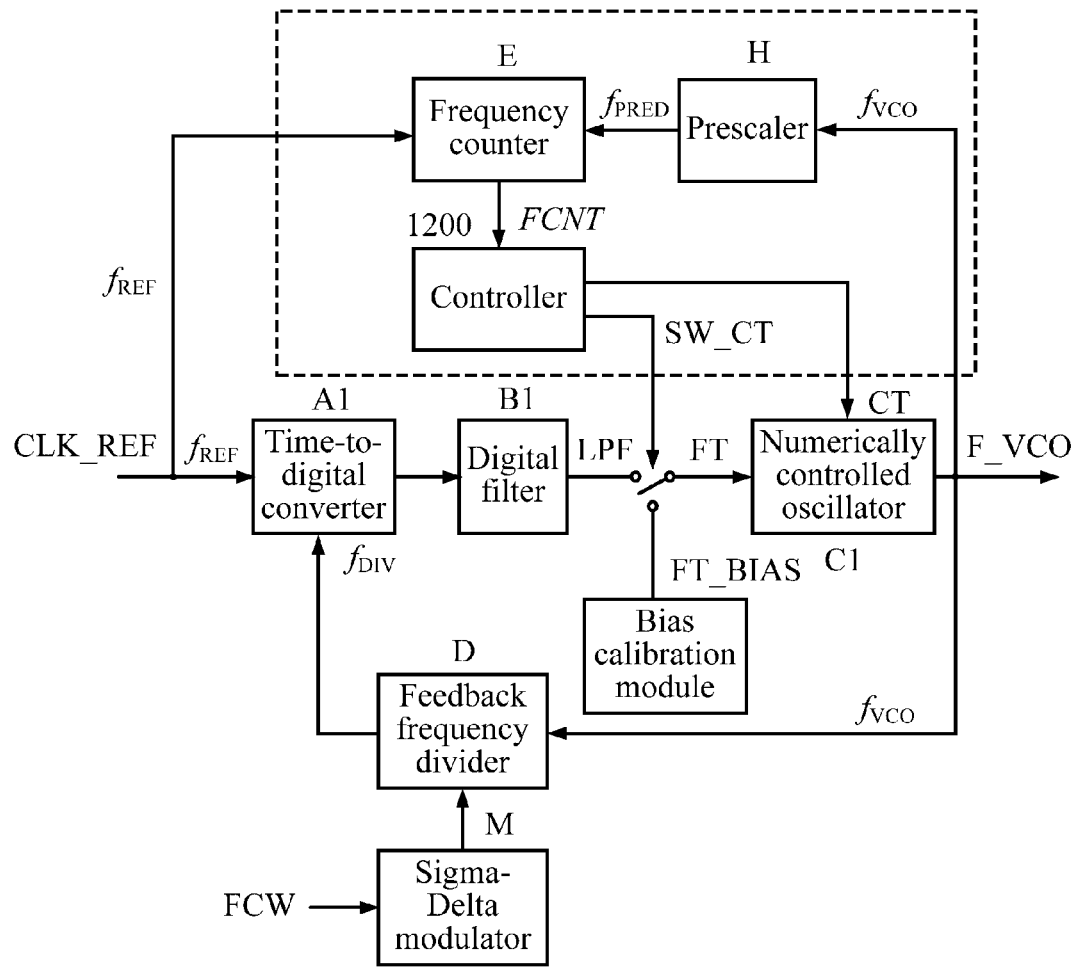
FIG. 12c is a schematic diagram of a phase-locked loop frequency calibration system in a case in which the phase-locked loop frequency calibration system is another digital fractional-N phase-locked loop according to the present invention.

In addition, the phase-locked loop in the present invention may also be a digital fractional-N phase-locked loop in another form. Different from the phase-locked loop in FIG. 12b, the phase-locked loop in FIG. 12c is applicable to a high frequency occasion. That is, a high-frequency digital fractional-N phase-locked loop of a prescaler is used. Other parts are the same as those in FIG. 12b, and details are not described herein again.

In a radio frequency application, an output frequency of a numerically controlled oscillator C1 is relatively high, and a frequency counter E cannot directly perform frequency counting on the output frequency of the numerically controlled oscillator C1. In this case, a prescaler H needs to be added after the numerically controlled oscillator C1, to reduce the output frequency of the numerically controlled oscillator C1 to a range that can be processed by the frequency counter E.

Figure 12D:
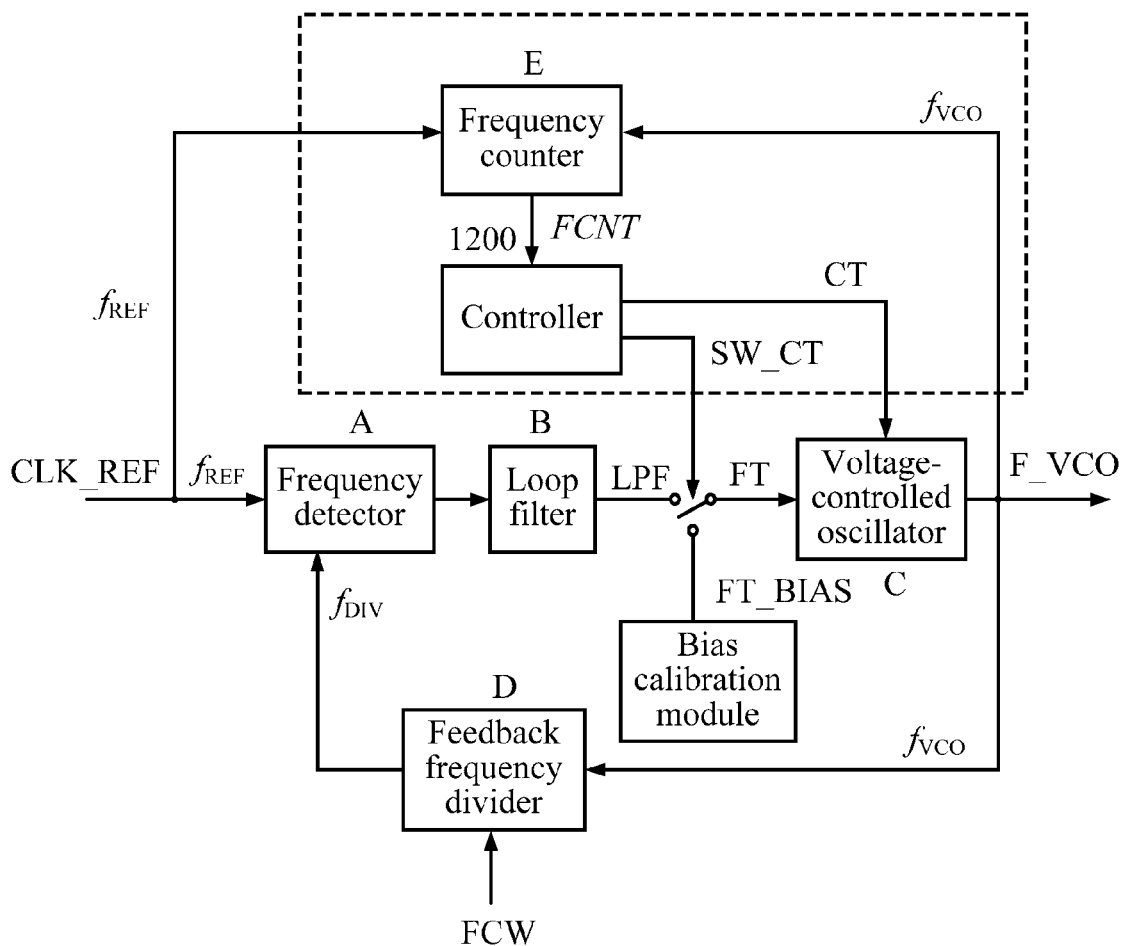
FIG. 12d is a schematic diagram of a phase-locked loop frequency calibration system in a case in which the phase-locked loop frequency calibration system is a digital integer-N phase-locked loop according to the present invention.

In addition, referring to FIG. 12d, the present invention further provides a digital integer-N phase-locked loop. A difference between FIG. 12d and FIG. 12a lies in that a Sigma-Delta modulator is omitted in FIG. 12d, because a digital integer-N phase-locked loop does not need a Sigma-Delta modulator.

The frequency calibration method, device, and system provided by the foregoing embodiments of the present invention can remarkably shorten a calibration time, without affecting a requirement on calibration precision.

The above descriptions are merely exemplary embodiments of the present invention, but are not intended to limit the present invention in any form. Although the present invention has disclosed the exemplary embodiments as above, the exemplary embodiments are not used to limit the present invention. A person skilled in the art can make, without departing from the scope of the technical solutions of the present invention, many possible variations and modifications to the technical solutions of the present invention by using the methods and technical content disclosed above, or revise the technical solutions of the present invention to equivalent embodiments with equivalent changes. Therefore, any simple alterations, equivalent changes, and modifications that are made to the foregoing embodiments according to the technical essence of the present invention without departing from the content of the technical solutions of the present invention all fall within the protection scope of the technical solutions of the present invention.

What is claimed is:

1. A phase-locked loop frequency calibration method, applied to selection of a subband for a multi-band voltage-controlled oscillator, and comprising:

performing, within a counting time $T_{CNT}[k]$, frequency counting on a frequency signal that is output in a current working subband by a voltage-controlled oscillator, to obtain a frequency count value FCNT[k], wherein the current working subband corresponds to a binary value of a current node in a binary search tree; and calculating an error between FCNT[k] and a target frequency count value $FCNT_{TARGET}[k]$, comparing an absolute value of the error with a predetermined value, dynamically adjusting $T_{CNT}[k]$ in a value range of $T_{CNT}[k]$ according to a comparison result, and determining, in combination with a binary search algorithm, a target subband in which the voltage-controlled oscillator works;

wherein the dynamically adjusting $T_{CNT}[k]$ in the value range of $T_{CNT}[k]$ according to the comparison result, and determining, in combination with the binary search algorithm, the target subband in which the voltage-controlled oscillator works comprises:

when the absolute value of the error is greater than or equal to the predetermined value, stopping counting an output frequency, corresponding to the current working subband, of the voltage-controlled oscillator, and entering a next subband in a binary search; and when the absolute value of the error is less than the predetermined value, increasing the counting time $T_{CNT}[k]$, continuing to obtain the frequency count value obtained by frequency counting performed on the frequency signal that is output in the current working subband by the voltage-controlled oscillator, and calculating an error between the newly read frequency count value and $FCNT_{TARGET}[k]$, when an absolute value of the error between the newly read frequency count value and $FCNT_{TARGET}[k]$ is greater than or equal to the predetermined value, stopping counting an output frequency, corresponding to the current working subband, of the voltage-controlled oscillator, and entering the next subband in the binary search; and when an absolute value of the error between the newly read frequency count value and $FCNT_{TARGET}[k]$ is less than the predetermined value, continuously increasing $T_{CNT}[k]$ and continuing to obtain the frequency count value obtained by frequency counting performed on the frequency signal that is output in the current working subband by the voltage-controlled oscillator, and continuing to compare an absolute value of an error between a newly read frequency count value and $FCNT_{TARGET}[k]$ with the predetermined value, this step is repeated until $T_{CNT}[k]$ reaches a maximum value in the value range of $T_{CNT}[k]$, and forcibly entering the next subband in the binary search; and while the binary search is completed, using a subband that corresponds to a minimum absolute value of an error in the foregoing errors as the target subband in which the voltage-controlled oscillator works.

2. The phase-locked loop frequency calibration method according to claim 1, wherein the entering the next subband in the binary search comprises:

when the frequency count value is greater than the target frequency count value, selecting, on a binary search path, a subband of which a binary value of a node is less than that of the current working subband, as the next subband; and when the frequency count value is less than the target frequency count value, selecting, on a binary search path, a subband of which a binary value of a node is greater than that of the current working subband, as the next subband.

3. The phase-locked loop frequency calibration method according to claim 1, wherein $T_{CNT}[k]=T_{REF}*R[k]$; and $FCNT_{TARGET}[k]=R[k] \times FCW$, wherein $T_{REF}$ is a period of a reference clock signal input to a phase-locked loop; R[k] is a counting time parameter, which is a positive integer changing with a current time k, and k is a positive integer; and FCW is a frequency control word signal of the phase-locked loop, and is a known quantity.

4. The phase-locked loop frequency calibration method according to claim 3, wherein $R[k]=2^{k-1}$;

$$T_{CNT}[k]=T_{REF}*R[k]=T_{REF}*2^{k-1};$$

$$FCNT_{TARGET}[k]=2^{k-1} \times FCW; \text{ and}$$

a maximum value of R[k] is $R_{max}$, and when $A=f_{REF}/f_{RES}$ is an integral power of 2, $R_{max}=A$; and when A is not an integral power of 2, $R_{max}$ is set to a minimum value in integral powers of 2 that are greater than A, wherein $f_{REF}=1/T_{REF}$; and $f_{RES}$ is target precision of the phase-locked loop, and is a known quantity.

5. A phase-locked loop frequency calibration system, comprising: a phase-locked loop, a frequency counter, and a controller, wherein the phase-locked loop comprises a multi-band voltage-controlled oscillator;

the phase-locked loop is configured to control, according to an input reference clock signal, the voltage-controlled oscillator to output a frequency signal;

the frequency counter is configured to perform, within a counting time $T_{CNT}[k]$, frequency counting on the frequency signal that is output in a current working subband by the voltage-controlled oscillator, to obtain a frequency count value FCNT[k], wherein the current working subband corresponds to a binary value of a current node in a binary search tree; and the controller is configured to calculate an error between FCNT[k] and a target frequency count value $FCNT_{TARGET}[k]$, compare an absolute value of the error with a predetermined value, dynamically adjust $T_{CNT}[k]$ in a value range of $T_{CNT}[k]$ according to a comparison result, and determine, in combination with a binary search algorithm, a target subband in which the voltage-controlled oscillator works;

wherein the controller is further configured to:

when the absolute value of the error is greater than or equal to the predetermined value, stop counting an output frequency, corresponding to the current working subband, of the voltage-controlled oscillator, and enter a next subband in a binary search; and when the absolute value of the error is less than the predetermined value, increase the counting time $T_{CNT}[k]$, and read a newly read frequency count value obtained by frequency counting performed on the frequency signal that is output in the current working subband by the voltage-controlled oscillator, and calculate an error between the newly read frequency count value and $FCNT_{TARGET}[k]$, when an absolute value of the error between the newly read frequency count value and $FCNT_{TARGET}[k]$ is greater than or equal to the predetermined value, stop counting an output frequency, corresponding to the current working subband, of the voltage-controlled oscillator, and enter a next subband in a binary search; and when the absolute value of the error between the newly read frequency count value and $FCNT_{TARGET}[k]$ is less than the predetermined value, continuously increase $T_{CNT}[k]$ and continue to read the frequency count value obtained by frequency counting performed on a frequency signal that is output in the current working subband by the voltage-controlled oscillator, and continue to compare the absolute value of the error between the frequency count value and $FCNT_{TARGET}[k]$ with the predetermined value, this step is repeated until $T_{CNT}[k]$ reaches a maximum value in the value range of $T_{CNT}[k]$, and forcibly enter a next subband in a binary search;

while the binary search is completed, use a subband that corresponds to a minimum absolute value of an error in the foregoing errors as the target subband in which the voltage-controlled oscillator works.

6. The phase-locked loop frequency calibration system according to claim 5, wherein the controller is specifically is further configured to:

when the frequency count value is greater than the target frequency count value, select, on a binary search path, a subband of which a binary value of a node is less than that of the current working subband, as the next subband; and when the frequency count value is less than the target frequency count value, select, on the binary search path, a subband of which a binary value of a node is greater than that of the current working subband, as the next subband.

7. The phase-locked loop frequency calibration system according to claim 5, wherein $T_{CNT}[k]=T_{REF}*R[k]$; and $FCNT_{TARGET}[k]=R[k] \times FCW$, wherein $T_{REF}$ is a period of a reference clock signal input to a phase-locked loop; R[k] is a counting time parameter, which is a positive integer changing with a current time k, and k is a positive integer; and FCW is a frequency control word signal of the phase-locked loop, and is a known quantity.

8. The phase-locked loop frequency calibration system according to claim 7, wherein $R[k]=2^{k-1}$;

$$T_{CNT}[k]=T_{REF}*R[k]=T_{REF}*2^{k-1};$$

$$FCNT_{TARGET}[k]=2^{k-1} \times FCW; \text{ and}$$

a maximum value of R[k] is $R_{max}$, and when $A=f_{REF}/f_{RES}$ is an integral power of 2, $R_{max}=A$; and when A is not an integral power of 2, $R_{max}$ is set to a minimum value in integral powers of 2 that are greater than A, wherein $f_{REF}=1/T_{REF}$; and $f_{RES}$ is target precision of the phase-locked loop, and is a known quantity.

9. The phase-locked loop frequency calibration system according to claim 5, wherein the phase-locked loop comprises: an analog integer-N phase-locked loop, an analog fractional-N phase-locked loop, a digital integer-N phase-locked loop, and a digital fractional-N phase-locked loop.

* * * * *